(12) United States Patent
Lee et al.

(10) Patent No.: US 12,713,932 B2
(45) Date of Patent: Aug. 18, 2026

(54) SEMICONDUCTOR DEVICE AND METHOD OF FORMING EMI SHIELDING MATERIAL IN TWO-STEP PROCESS USING LIGHT SINTERING

(71) Applicant: JCET STATS ChipPAC Korea Limited, Incheon (KR)

(72) Inventors: SeungHyun Lee, Incheon (KR); HeeSoo Lee, Incheon (KR); YongMoo Shin, Incheon (KR); ChangOh Kim, Incheon (KR)

(73) Assignee: JCET STATS ChipPAC Korea Limited (KR)

(*) Notice: Subject to any disclaimer, the term of this patent is extended or adjusted under 35 U.S.C. 154(b) by 502 days.

(21) Appl. No.: 18/351,687

(22) Filed: Jul. 13, 2023

(65) Prior Publication Data

US 2025/0273590 A1 Aug. 28, 2025

Related U.S. Application Data

(63) Continuation-in-part of application No. 17/812,339, filed on Jul. 13, 2022, now Pat. No. 12,438,099.

(51) Int. Cl.
*H10W 74/10* (2026.01)
*H01Q 1/22* (2006.01)
(Continued)

(52) U.S. Cl.
CPC .......... *H10W 42/20* (2026.01); *H01Q 1/2283* (2013.01); *H01Q 1/526* (2013.01); *H10W 44/20* (2026.01); *H10W 70/05* (2026.01); *H10W 70/093* (2026.01); *H10W 70/685* (2026.01); *H10W 72/075* (2026.01); *H10W 72/50* (2026.01); *H10W 74/016* (2026.01); *H10W 74/114* (2026.01); *H10W 44/248* (2026.01)

(58) Field of Classification Search
None
See application file for complete search history.

(56) References Cited

U.S. PATENT DOCUMENTS 5,639,989 A 6/1997 Higgins, III
9,859,232 B1 1/2018 Chiang et al.
(Continued)

*Primary Examiner* — Jay C Chang
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and encapsulant deposited over the substrate. An electrical connector is disposed over the substrate outside the encapsulant. An antenna can be formed over the substrate. A first shielding material is disposed over a portion of the encapsulant without covering the electrical connector with the first shielding material. The first shielding material is disposed over the portion of the encapsulant and the portion of the substrate using a direct jet printer. A light source emitting an ultraviolet light or intense pulsed light is directed at the first shielding material to induce sintering. A cover is disposed over the electrical connector. A second shielding material is disposed over the encapsulant to prevent the second shielding material from reaching the electrical connector. The second shielding material overlaps the first shielding material and covers a side surface of the encapsulant and a side surface of the substrate.

24 Claims, 24 Drawing Sheets

(51) Int. Cl.

| | |
|---|---|
| ***H01Q 1/52*** | (2006.01) |
| ***H10W 42/20*** | (2026.01) |
| ***H10W 44/20*** | (2026.01) |
| ***H10W 70/05*** | (2026.01) |
| ***H10W 70/685*** | (2026.01) |
| ***H10W 72/00*** | (2026.01) |
| ***H10W 72/50*** | (2026.01) |
| ***H10W 74/01*** | (2026.01) |

(56) References Cited

U.S. PATENT DOCUMENTS

| | | | | |
|---|---|---|---|---|
| 11,581,274 | B2 * | 2/2023 | Chen | H10W 44/20 |
| 2021/0328339 | A1 | 10/2021 | Tsai et al. | |
| 2022/0007554 | A1 | 1/2022 | Jeon | |
| 2022/0102255 | A1 * | 3/2022 | Shinkai | H01L 23/49811 |
| 2022/0157739 | A1 * | 5/2022 | Lee | H10P 72/74 |
| 2023/0268295 | A1 | 8/2023 | Chen et al. | |

* cited by examiner 126
124
128
122
120

136
130d
132
130c
134
138
130b
130a
104
110
112
114

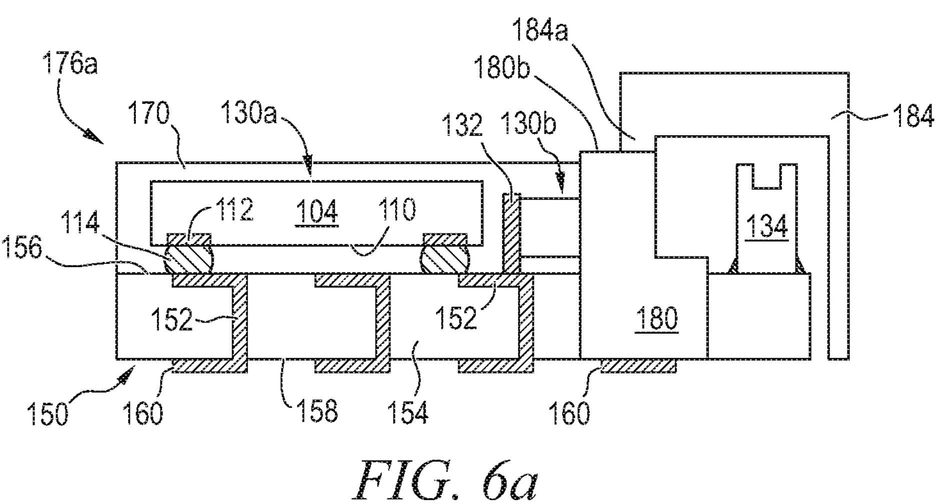
FIG. 6a
176a
184a
180b
193
170
184
194
190
190
134
196
150
160
158
160
180
FIG. 6b
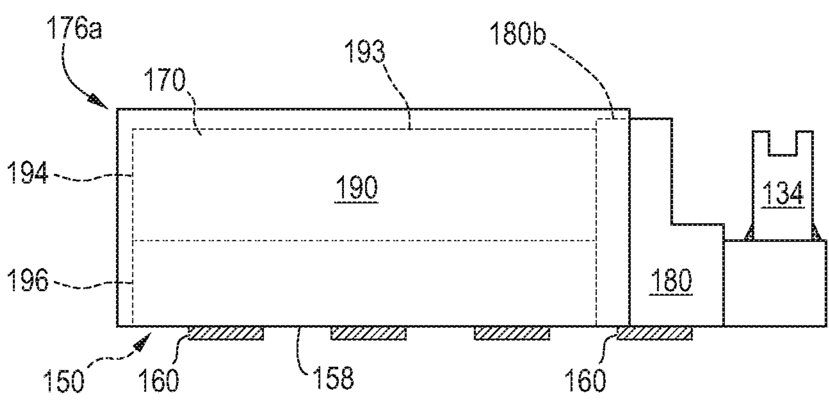
FIG. 6c

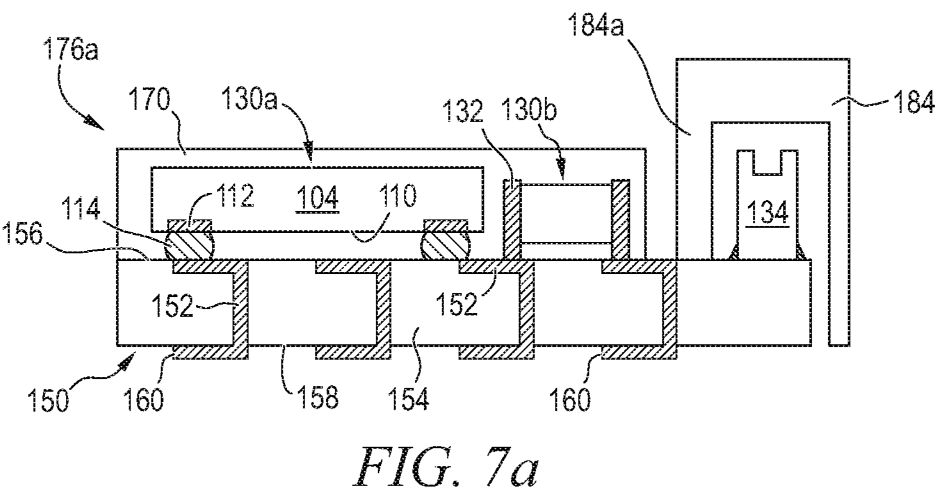
FIG. 7a
FIG. 7b
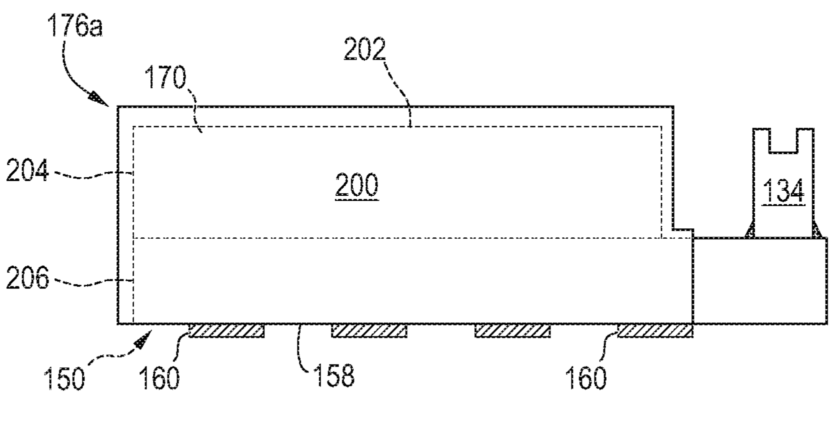
FIG. 7c

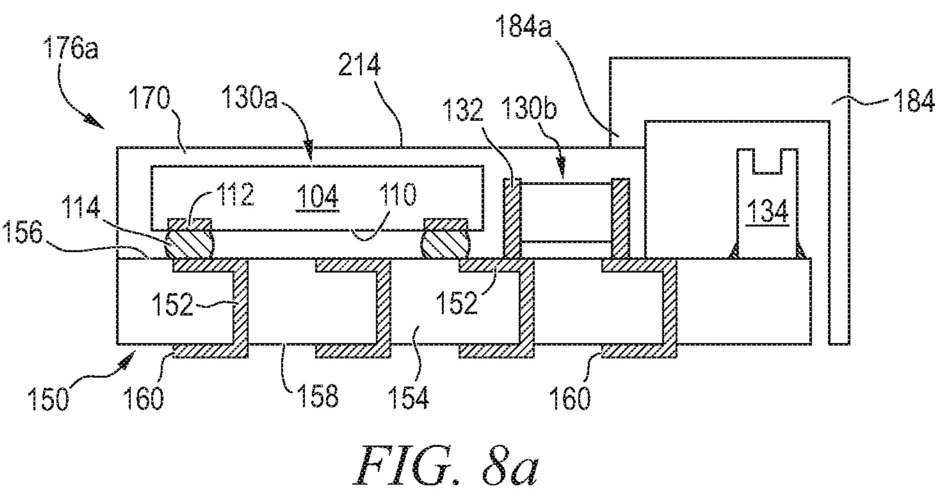
FIG. 8a
176a
184a
214
170
184
224
220
134
220
226
150
160
158
160
FIG. 8b
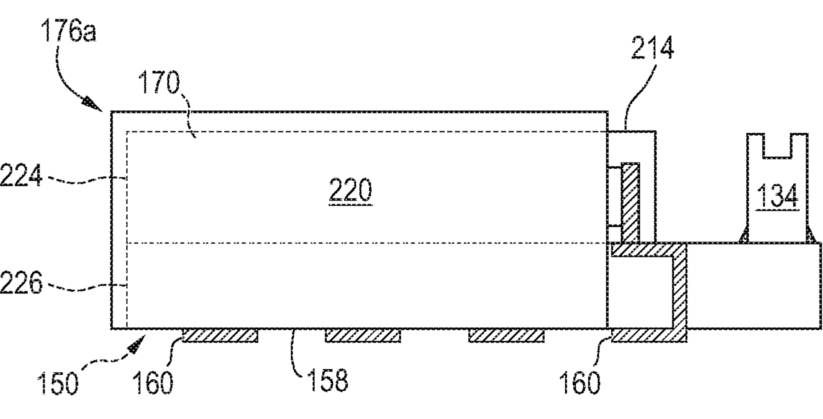
FIG. 8c

SEMICONDUCTOR DEVICE AND METHOD OF FORMING EMI SHIELDING MATERIAL IN TWO-STEP PROCESS USING LIGHT SINTERING

CLAIM OF DOMESTIC PRIORITY

The present application is a continuation-in-part of U.S. patent application Ser. No. 17/812,339, filed Jul. 13, 2022, which application is incorporated herein by reference.

FIELD OF THE INVENTION

The present invention relates in general to semiconductor devices and, more particularly, to a semiconductor device and method of forming electromagnetic interference (EMI) shielding material in a two-step process using light sintering.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate. An electrical connector is disposed on the substrate for electrical communication between the electrical components and external devices. The SIP module is partially molded in that the encapsulant does not extend to the electrical connector. The electrical connector is freestanding on the substrate.

The SIP module includes high speed digital and RF electrical components, highly integrated for small size and low height, and operating at high clock frequencies. An electromagnetic shielding material is commonly conformally applied over the encapsulant. The electromagnetic shielding layer reduces or inhibits EMI, RFI, and other inter-device interference, for example as radiated by high-speed digital devices, from affecting neighboring devices within or adjacent to SIP module.

However, it is important that the electrical connector be kept free of spurious shielding material to avoid failures. Selective EMI shielding with high accuracy, such as cap or spray coating, is required. However, spray coating can reduce productivity as units per hour (UPH) decreases. In case of sputtering method using cap, to satisfy the minimum sputtering thickness with the shielding effect, the minimum clearance between the shielding area and the cap is required, resulting in package design constraints.

In addition, the conformal application of EMI shielding material is difficult to control for partially molded devices, particularly with respect to the freestanding electrical connector. The conformal shielding material can readily invade the space around the electrical connector, and bleed into the connector's contacts causing electrical shorts, or discontinuity when attempting to mate with the connector. Attempts have been made to mask or tape off the electrical connector while forming the shielding material. In some applications, with tight component spacing, the mask and tape are difficult to reliably isolate the electrical connector and potentially can damage the electrical connector.

BRIEF DESCRIPTION OF THE DRAWINGS

FIGS. 6*a*-6*c* illustrate an alternate application of shielding material to the AoP module using a two-step process;

FIGS. 7*a*-7*d* illustrate an alternate application of shielding material to the AoP module using a two-step process;

FIGS. 8*a*-8*d* illustrate an alternate application of shielding material to the AoP module using a two-step process;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
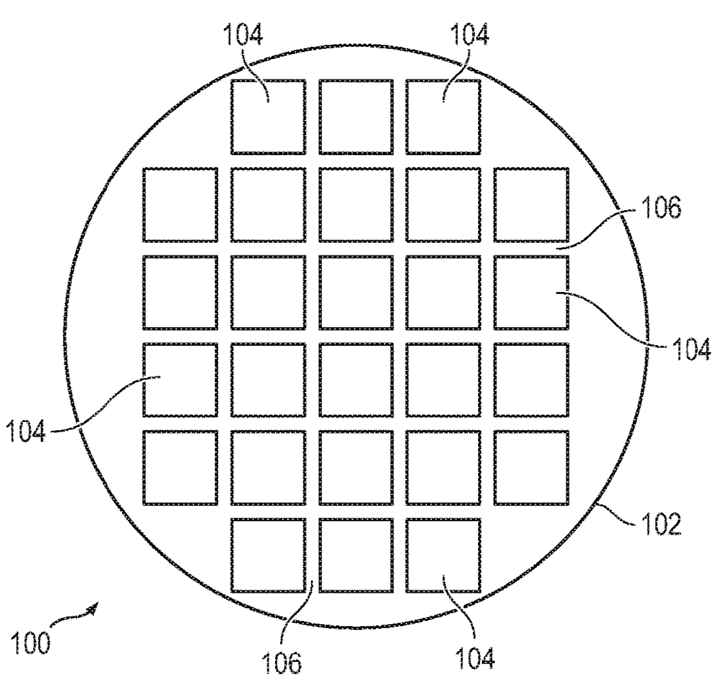
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
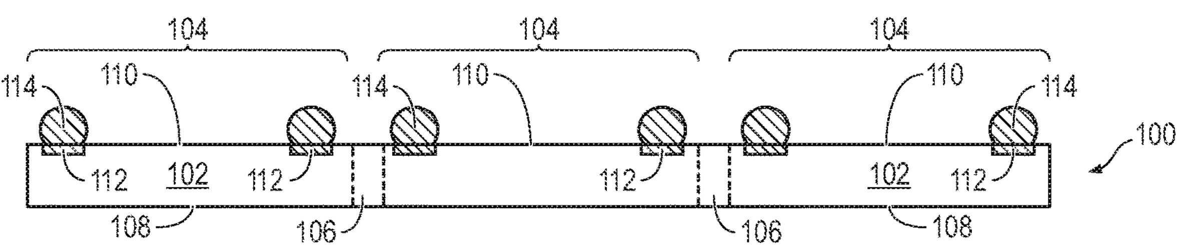

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
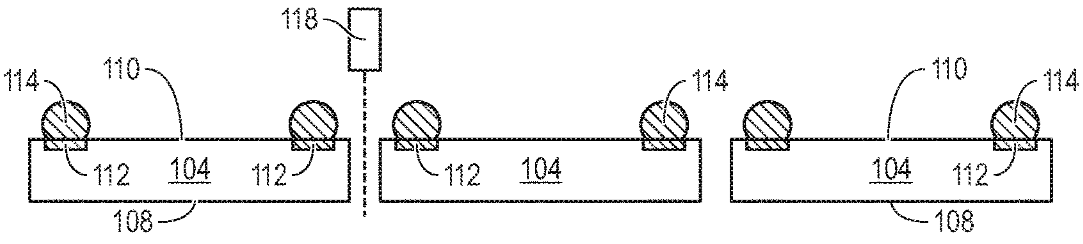

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figures 2A, 2B, 2C:
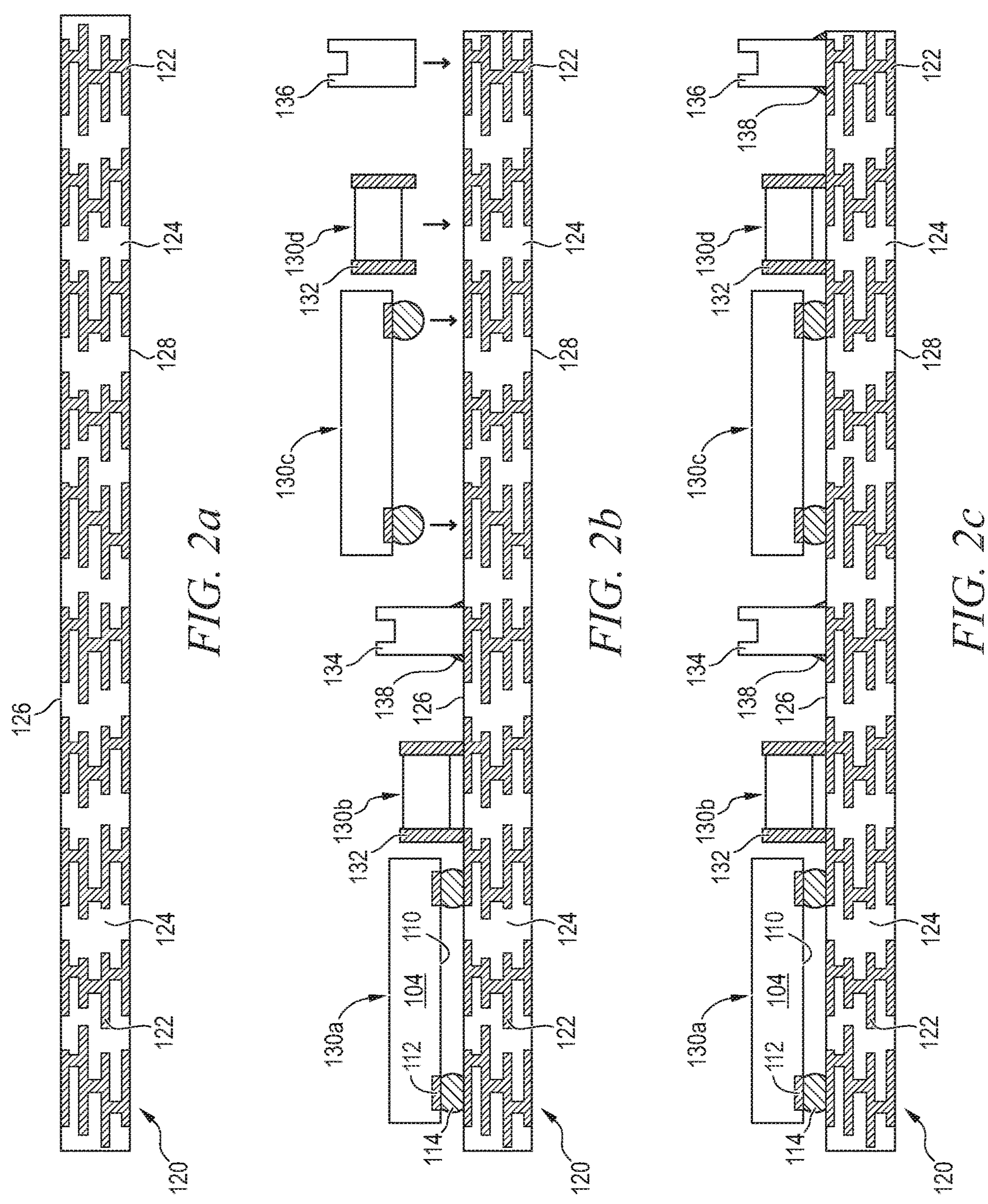
FIGS. 2*a*-2*d* illustrate a process of forming an SiP module.

FIGS. 2*a*-2*d* illustrate a process of disposing electrical components and electrical connector over an interconnect substrate. FIG. 2*a* shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122. There can be multiple conductive layers like 122 separated by insulating layers 124.

In FIG. 2*b*, a plurality of electrical components 130*a*-130*d* is disposed on surface 126 of interconnect substrate 120 and electrically and mechanically connected to conductive layers 122. Electrical components 130*a*-130*d* are each positioned over substrate 120 using a pick and place operation. For example, electrical component 130*a* and 130*c* can be similar to semiconductor die 104 from FIG. 1*c* with active surface 110 and bumps 114 oriented toward surface 126 of substrate 120. Electrical components 130*b* and 130*d* can be discrete electrical devices, or IPDs, such as a diode, transistor, resistor, capacitor, and inductor, with terminals 132 disposed on surface 126 of interconnect substrate 120 and electrically and mechanically connected to conductive layers 122. Alternatively, electrical components 130*a*-130*d* can include other semiconductor die, semiconductor packages, surface mount devices, discrete electrical devices, or IPDs.

Electrical components 130*a*-130*d* are brought into contact with surface 126 of substrate 120. FIG. 2*c* illustrates electrical components 130*a*-130*d* electrically and mechanically connected to conductive layers 122 of substrate 120. Electrical connector 134 and 136 are disposed on surface 126 of interconnect substrate 120 and electrically and mechanically connected to conductive layers 122 with bumps or conductive paste 138. Electrical connector 134 is electrically connected through conductive layer 122 of substrate 120 to electrical components 130*a*-130*b*. Electrical connector 136 is electrically connected through conductive layer 122 of substrate 120 to electrical components 130*c*-130*d*. In one embodiment, connectors 134 and 136 are board-to-board (B2B) connectors.

Figure 2D:
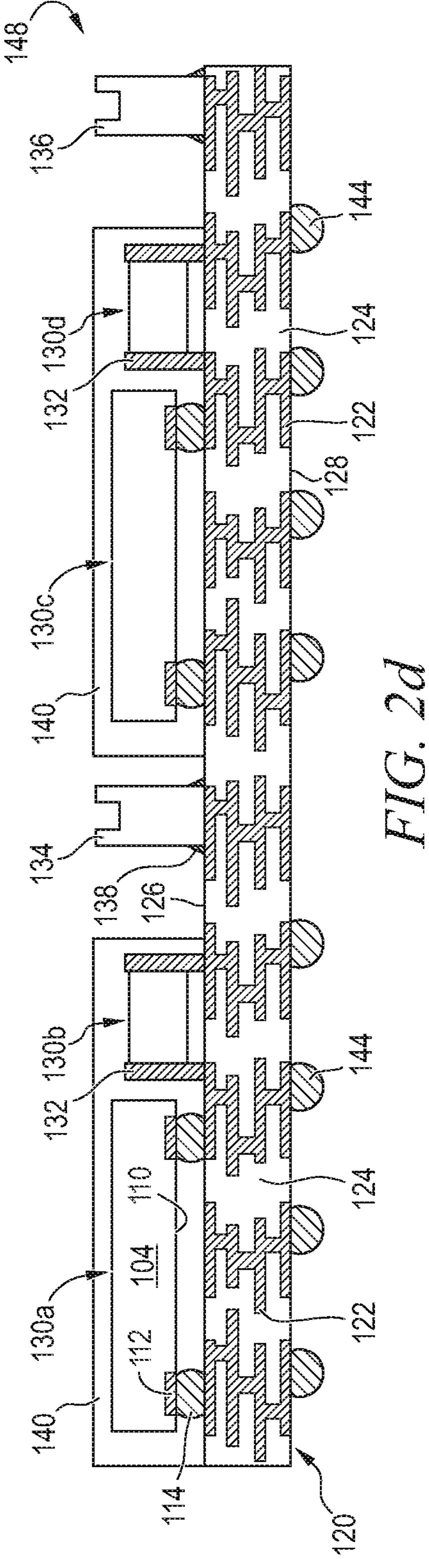

In FIG. 2*d*, an encapsulant or molding compound 140 is deposited over and around electrical components 130*a*-130*b* and substrate 120 using a paste printing, compressive molding, transfer molding, liquid encapsulant molding, vacuum lamination, spin coating, or other suitable applicator. Encapsulant 140 is also deposited over and around electrical components 130*c*-130*d*. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

An electrically conductive bump material is deposited over conductive layer 122 on surface 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 144. In one embodiment, bump 144 is formed over a UBM having a wetting layer, barrier layer, and adhesive layer. Bump 144 can also be compression bonded or thermocompression bonded to conductive layer 122. In one embodiment, bump 144 is a copper core bump for durability and maintaining its height. Bump 144 represents one type of interconnect structure that can be formed over conductive layer 122. The interconnect structure can also use bond wires, conductive paste, stud bump, micro bump, or other electrical interconnect.

The combination of electrical components 130*a*-130*d* disposed on substrate 120 and covered by encapsulant 140, as shown in FIG. 2*d*, constitutes system-in-package (SiP) module 148.

Figure 3A:
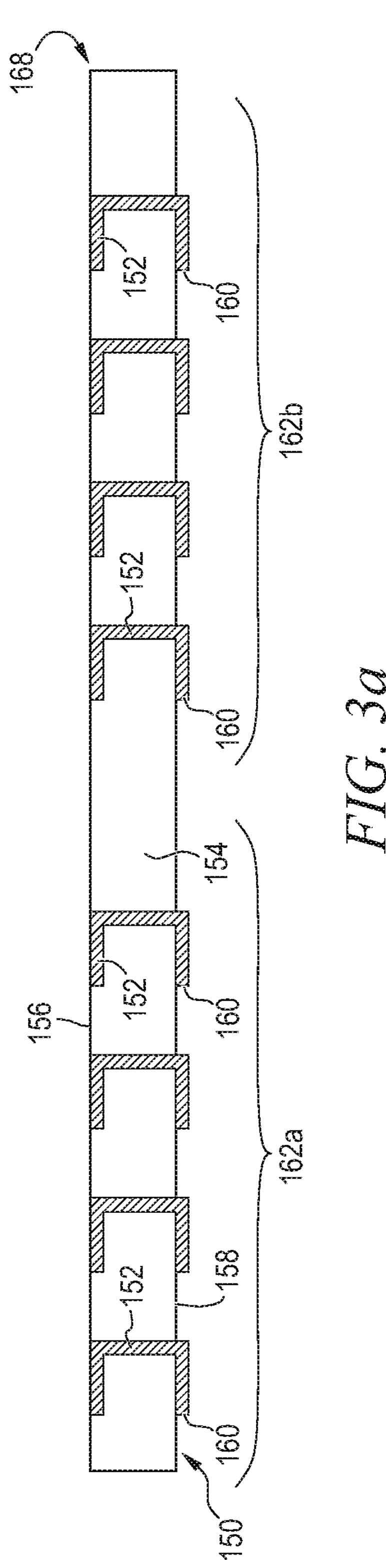
FIGS. 3*a*-3*d* illustrate a process of forming an AoP module.

In another embodiment, a cross-sectional view of interconnect substrate 150 is shown including conductive layers 152 and insulating layer 154, as in FIG. 3*a*. Conductive layer 152 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 152 provides horizontal electrical interconnect across substrate 150 and vertical electrical interconnect between top surface 156 and bottom surface 158 of substrate 150. Portions of conductive layer 152 can be electrically common or electrically isolated depending on the design and function of semiconductor die 104 and other electrical components. Insulating layer 154 contains one or more layers of SiO2, Si3N4, SiON, Ta2O5, Al2O3, solder resist, prepreg, polyimide, polymer, BCB, PBO, and other material having similar insulating and structural properties. Insulating layers 154 can be formed using PVD, CVD, printing, lamination, spin coating, spray coating, sintering or thermal oxidation. Insulating layer 154 provides isolation between conductive layers 152. There can be multiple conductive layers like 152 separated by insulating layer 154.

Conductive layer 160 is formed over surface 158 of substrate 150 and electrically connected to conductive layer 152. Conductive layer 160 can be one or more layers of Al, Cu, Sn, Ni, Au, Ag, or other suitable electrically conductive material.

Figure 3B:
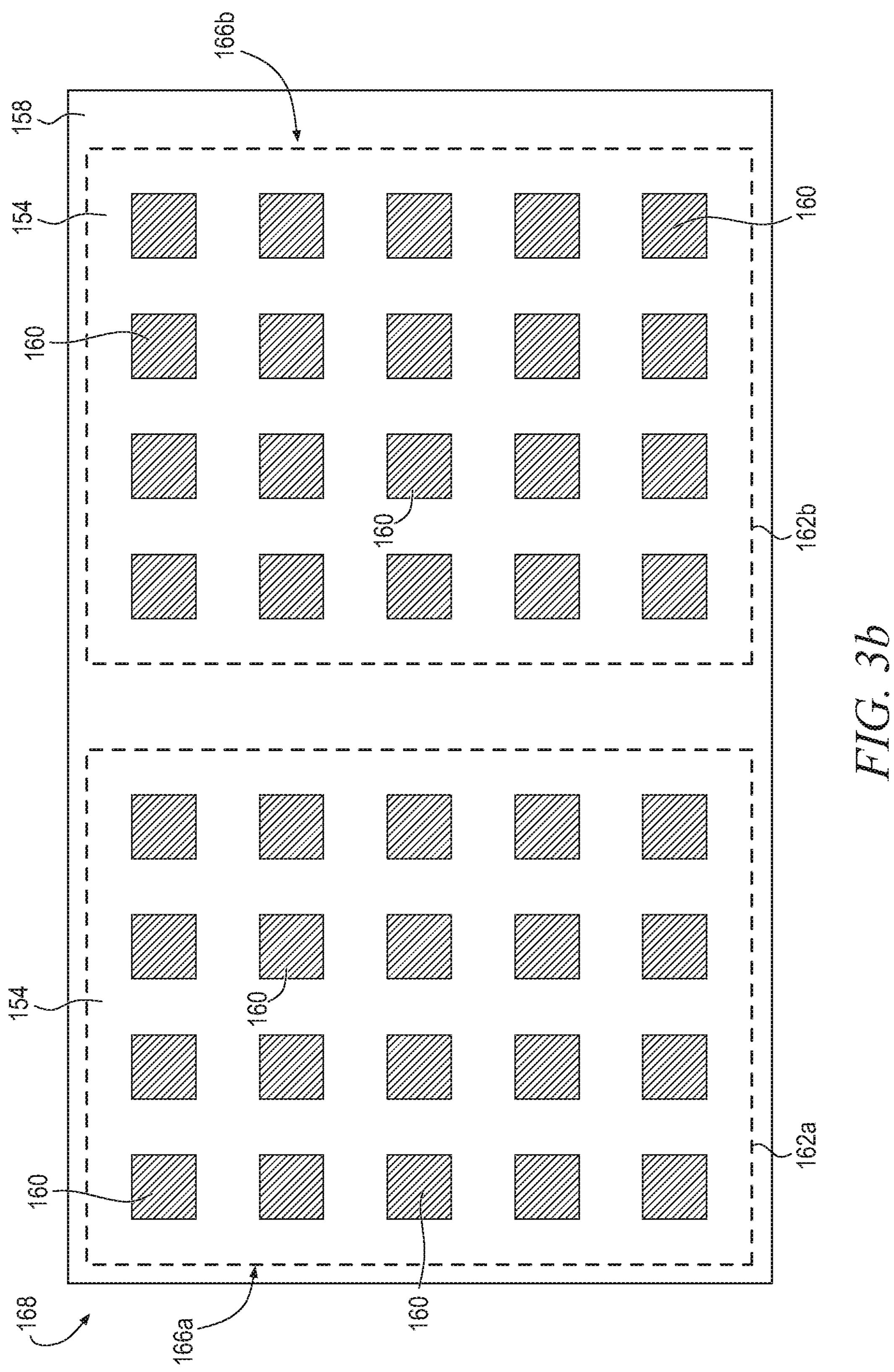

FIG. 3*b* is a top view of conductive layer 160 on surface 158 of RF antenna interposer substrate 168. Conductive layer 160 includes an array of islands of conductive material suitable to provide transmission and reception of RF signals, i.e., an RF antenna. Conductive layer 160 operates as multiple RF antenna 166*a* and 166*b* exposed from surface 158 of RF antenna substrate 168. In particular, the array of islands 162*a*, 162*b* of conductive layer 160 are exposed from surface 158 to improve RF transmission and reception performance and quality. In one embodiment, a first group of islands 162*a* of conductive layer 160 serves as a first antenna 166*a* electrically connected through conductive layers 152 to provide RF transmission and reception for a first electrical component. A second group of islands 162*b* of conductive layer 160 serves as a second antenna 166*b* electrically connected through conductive layers 152 to provide RF transmission and reception for a second electrical component. Although two RF antennas 166*a*-166*b* are shown in FIG. 3*a*-3*b* for purposes of a simplified description, RF antenna substrate 168 can have any number of RF antenna like 166*a*-166*b*.

Figure 3C:
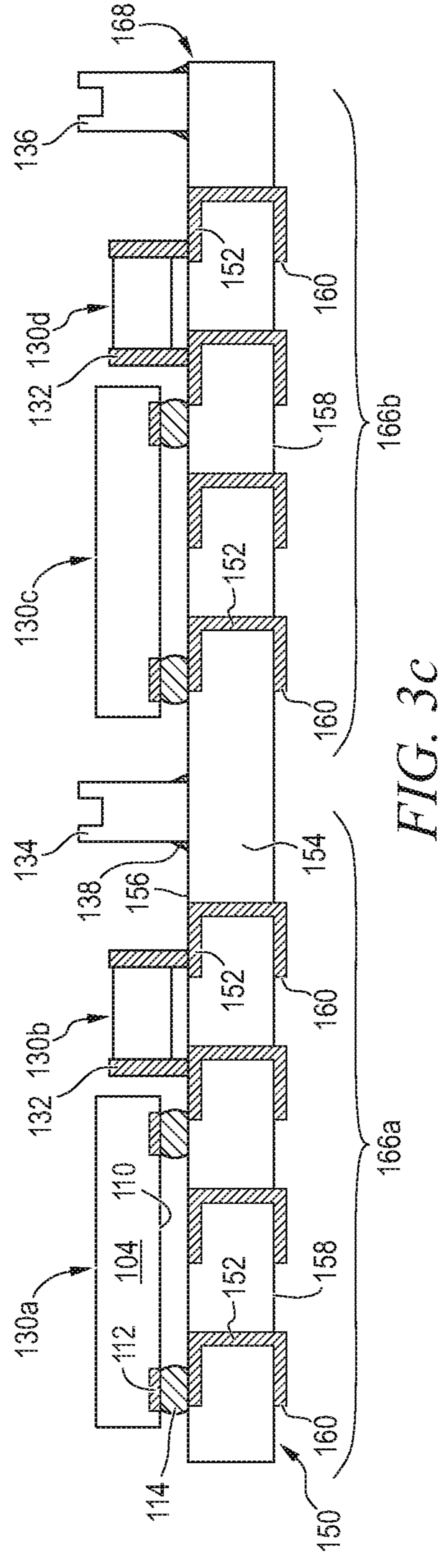

In FIG. 3*c*, a plurality of electrical components 130*a*-130*d* is disposed on surface 156 of RF antenna substrate 168 and mechanically connected to conductive layers 152. Electrical components 130*a*-130*d* are each positioned over substrate 120 using a pick and place operation, similar to FIGS. 2*b*-2*c*. Elements having a similar function are assigned the same reference number in the figures. Electrical connectors 134 and 136 are disposed on surface 156 of RF antenna substrate 168 and electrically and mechanically connected to conductive layers 152 with bumps or conductive paste 138. Electrical connector 134 is electrically connected through conductive layer 152 to electrical components 130*a*-130*b*. Electrical connector 136 is electrically connected through conductive layer 152 to electrical components 130*c*-130*d*.

Figure 3D:
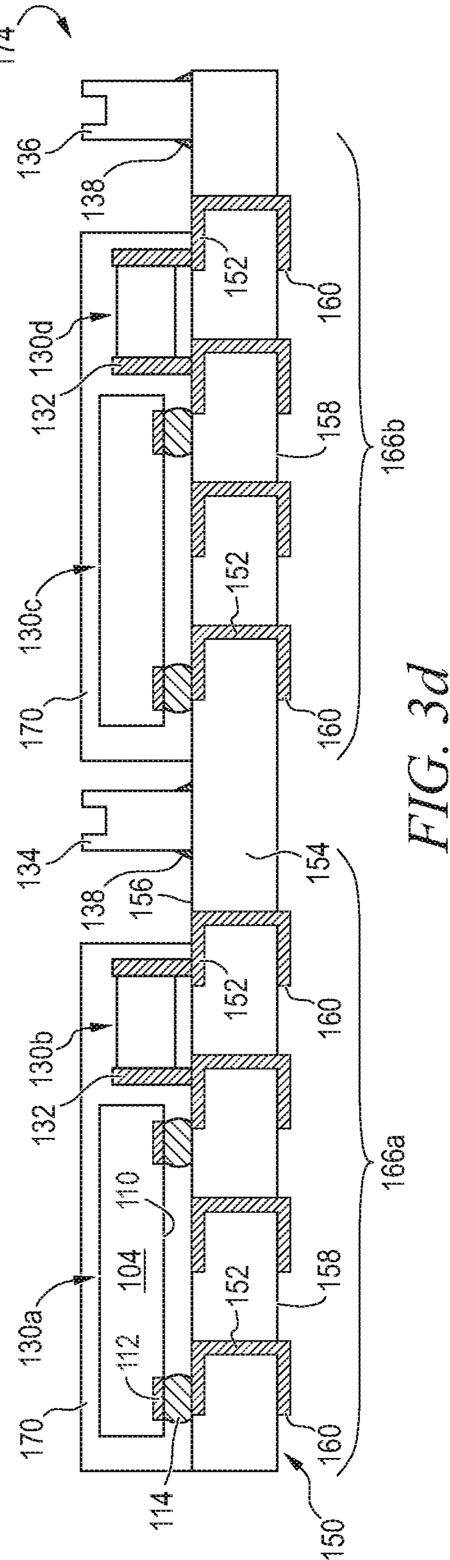

In FIG. 3*d*, an encapsulant or molding compound 170 is deposited over and around electrical components 130*a*-130*b* on interposer 168 using a paste printing, compressive molding, transfer molding, liquid encapsulant molding, vacuum lamination, spin coating, or other suitable applicator. Encapsulant 170 is also deposited over and around electrical components 130*c*-130*d*. Encapsulant 170 can be polymer composite material, such as epoxy resin with filler, epoxy acrylate with filler, or polymer with proper filler. Encapsulant 170 is non-conductive, provides structural support, and environmentally protects the semiconductor device from external elements and contaminants.

The combination of electrical components 130*a*-130*d* disposed on RF antenna substrate 168 and covered by encapsulant 170, as shown in FIG. 3*d*, constitutes RF antenna SiP wafer 174. In one embodiment, RF antenna SiP wafer 174 contains millimeter wave devices applicable to 5G cellular networks.

Figure 4:
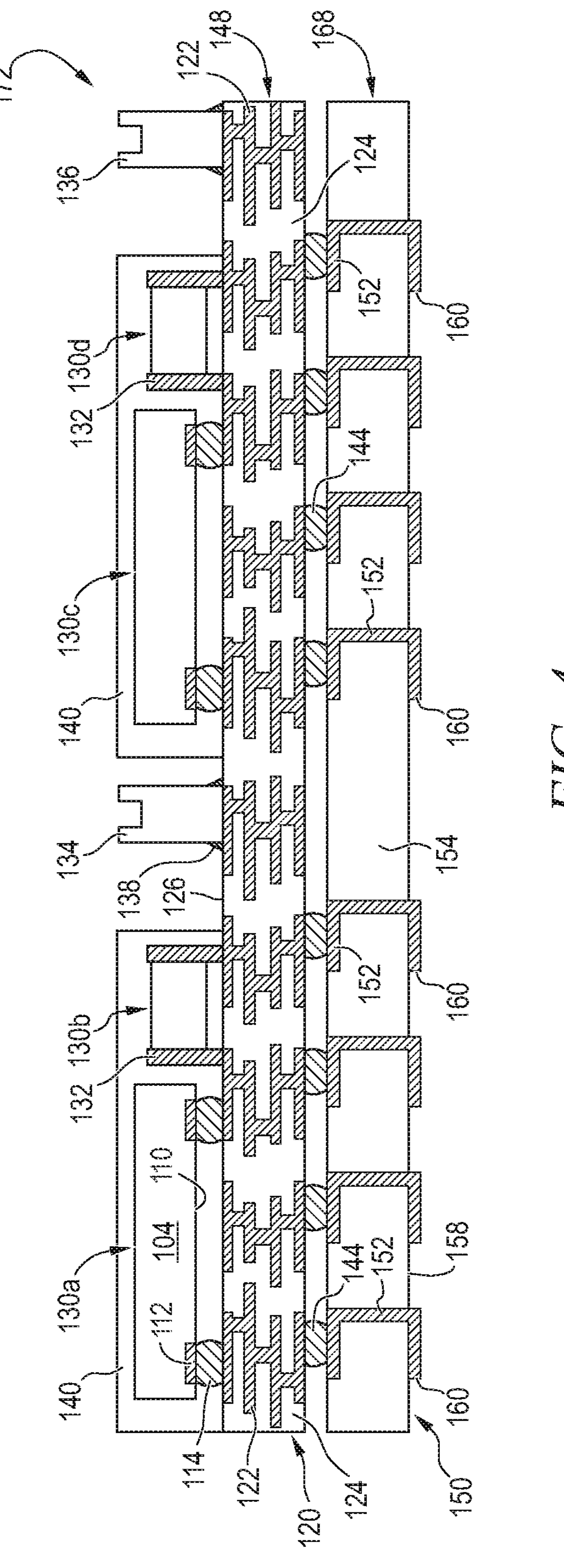
FIG. 4 illustrates a combination of the SIP module and RF antenna substrate as a wafer.

FIG. 4 illustrates another embodiment with Sip module 148 from FIG. 2*d* disposed on RF antenna substrate 168, collectively antenna-on-package (AoP) wafer 172. Electrical components 130*a*-130*d* are electrically connected to RF antenna 166*a*-166*b* and electrical connectors 134 and 136, respectively, through interconnect substrate 120 and bumps 144.

Figure 5A:
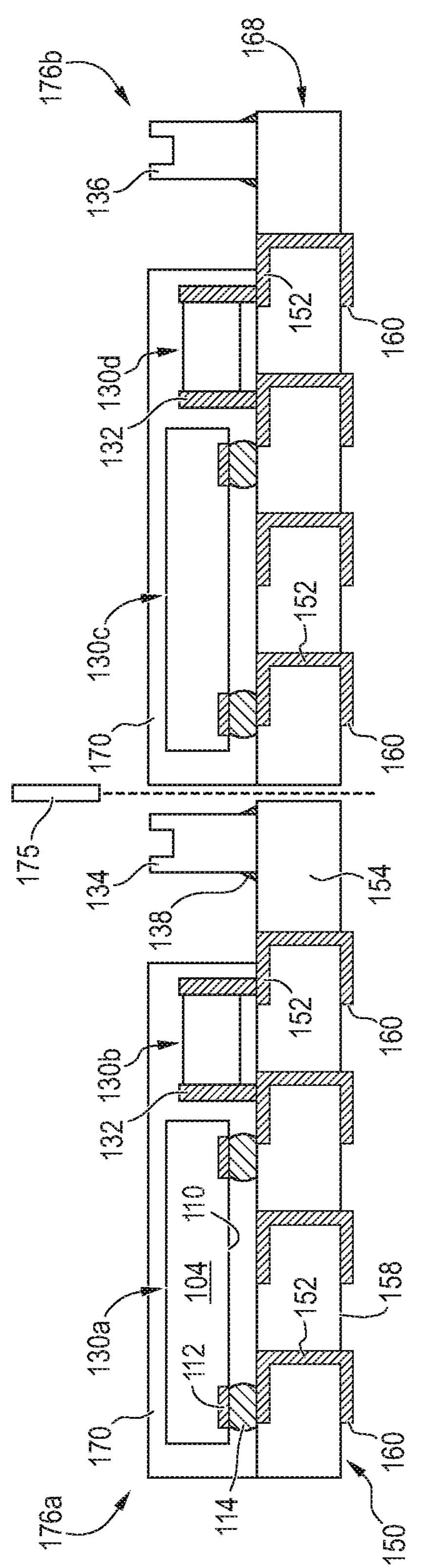
FIGS. 5*a*-5*h* illustrate application of shielding material to the AoP module using a two-step process.

RF antenna SiP wafer 174 from FIG. 3*d* is singulated using saw blade or laser cutting tool 175 into individual RF AoP modules 176*a* and 176*b*, as shown in FIG. 5*a*. AoP wafer 172 from FIG. 4 can be singulated into individual RF AoP modules in a similar manner. The following discussion addresses RF AoP module 176*a*, although the same description applies to RF AoP module 176*b* and RF AoP modules from AoP wafer 172. As noted infra, RF AoP module 176*a* includes electrical connector 134 as a B2B connector providing electrical connectivity to electrical components 130*a*-130*b*, RF antenna substrate 168, and other PCBs through the connector, possibly containing other electrical components.

Electrical components 130*a*-130*b* may contain IPDs that are susceptible to or generate EMI, RFI, harmonic distortion, and inter-device interference. For example, the IPDs contained within electrical components 130*a*-130*b* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*b* contain digital circuits switching at a high frequency, which could interfere with the operation of IPDs in RF AOP module 176*a*.

To address EMI, RFI, harmonic distortion, and inter-device interference, RF antenna SiP module 176*a* will be conformally covered by shielding material. However, electrical connector 134 must remain free of shielding material and will need to be covered to protect the connector and avoid introducing shielding material into the connector's contacts.

Figure 5B:
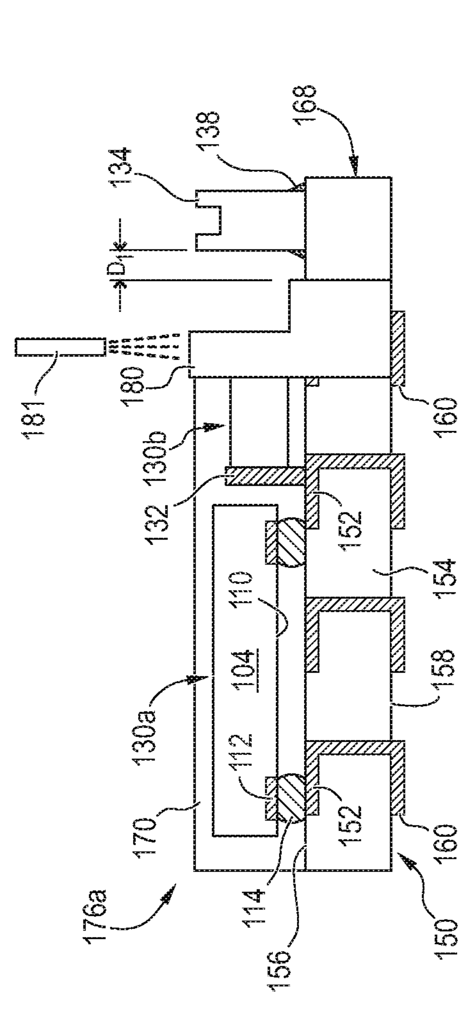

In a first step, electromagnetic shielding material 180 is applied over a portion of encapsulant 170 and a portion of surface 156 of substrate 150, as shown in FIG. 5*b*. Electromagnetic shielding material 180 can be one or more layers of Al, Cu, Sn, Ni, Au, Ag, or other suitable conductive material. Alternatively, electromagnetic shielding material 180 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electrical connector 134 is mechanically and electrically connected to conductive layer 152 of substrate 150 with bumps or conductive paste 138. Electromagnetic shielding material 180 is applied in a maskless manner, e.g., by direct jet printing using direct jet printer 181, with sufficient control to avoid getting shielding material on electrical connector 134. Shielding material 180 provides partial coverage of RF AoP module 176*a*, without encroaching on the area occupied by electrical connector 134. In one embodiment, the applied shielding material 180 remains separated from electrical connector 134 by distance D1 of at least 50 micrometers (μm).

Figure 5C:
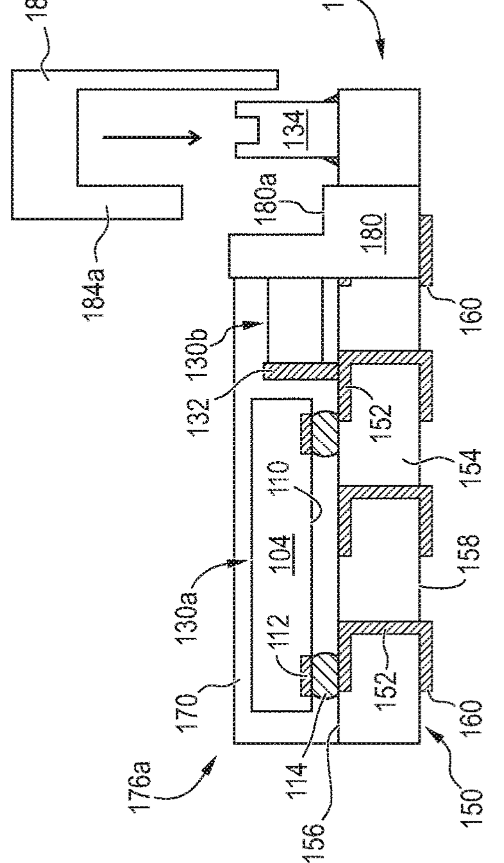
Figure 5D:
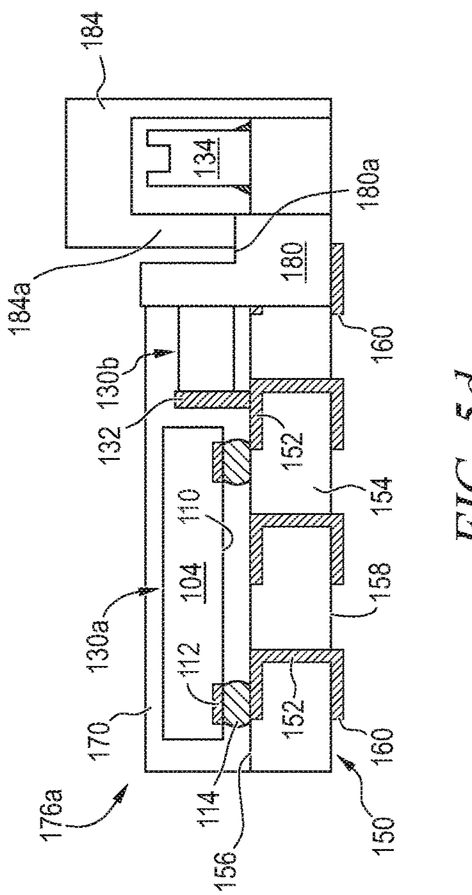
Figure 5E:
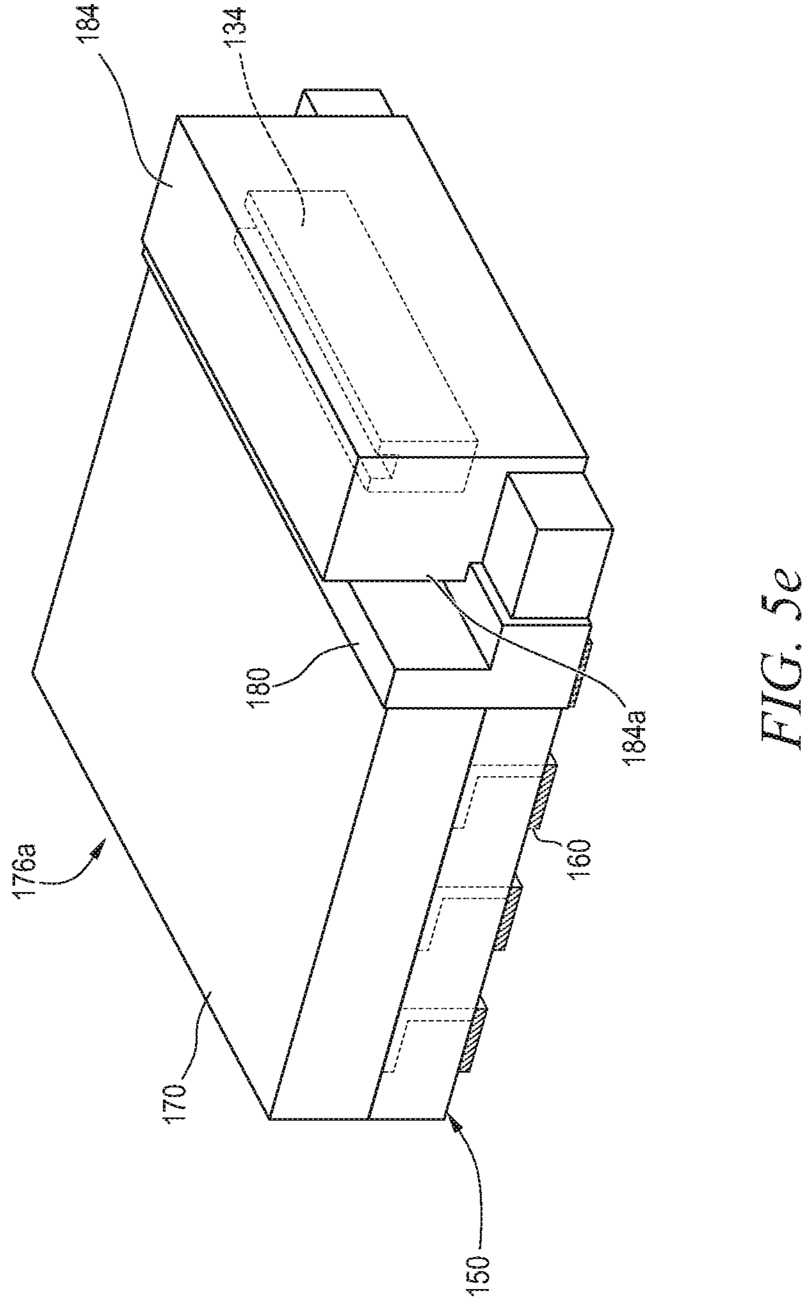

In FIG. 5*c*, cover mask 184 is positioned above electrical connector 134. Cover mask 184 is brought into contact with shielding material 180. FIG. 5*d* shows cover mask 184 covering or enclosing electrical connector 134 with vertical portion 184*a* contacting lower surface 180*a* of shielding material 180. FIG. 5*e* is a perspective view of cover mask 184 enclosing electrical connector 134 on all sides in a manner to prevent subsequently-applied shielding material from reaching the connector.

Figure 5F:
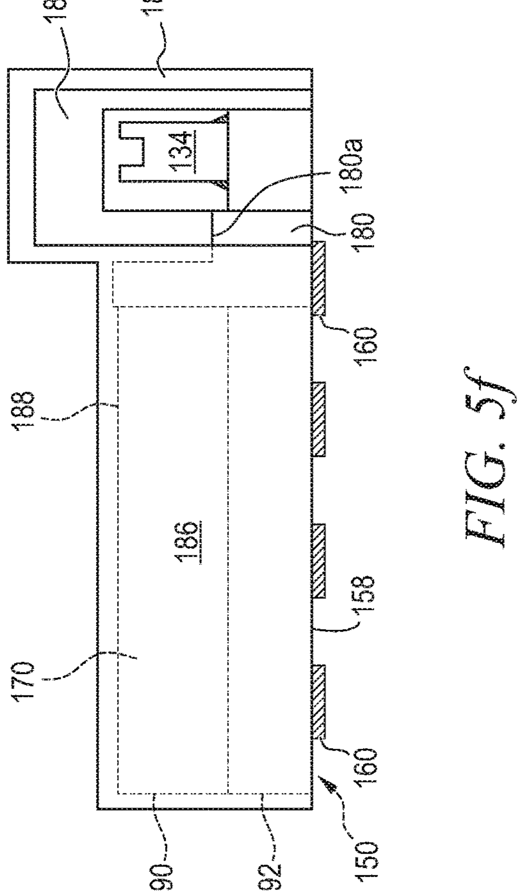

In a second step, electromagnetic shielding layer 186 is formed or disposed over surface 188 of encapsulant 170 by conformal application of the shielding material, as shown in FIG. 5*f*. Electromagnetic shielding material 186 can be one or more layers of Al, Cu, Sn, Ni, Au, Ag, or other suitable conductive material. Alternatively, electromagnetic shielding material 186 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 186 overlaps a first portion of electromagnetic shielding material 180, while a second portion of shielding material 180 remains under cover 184. In addition, electromagnetic shielding material 186 covers side surfaces 190 of encapsulant 170, as well as side surface 192 of substrate 150. At least to some extent, electromagnetic shielding material 186 covers cover mask 184, which is protecting electrical connector 134. Electrical connector 134 remains free of shielding material during this second step.

Figure 5G:
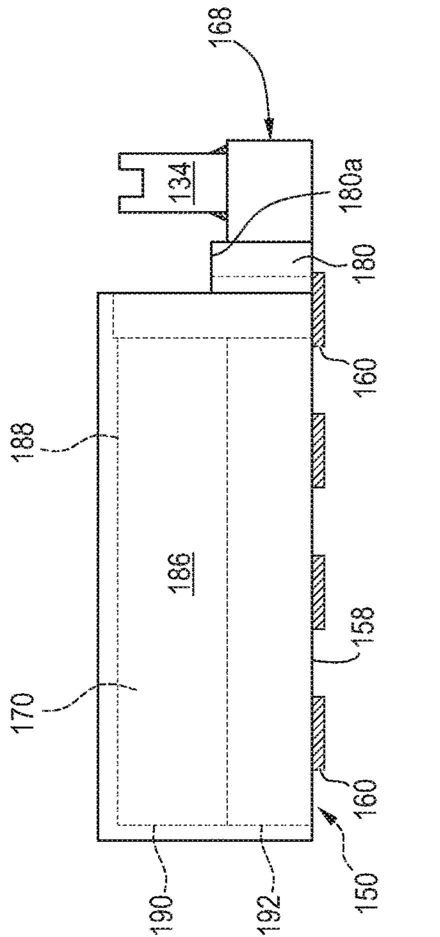
Figure 5H:
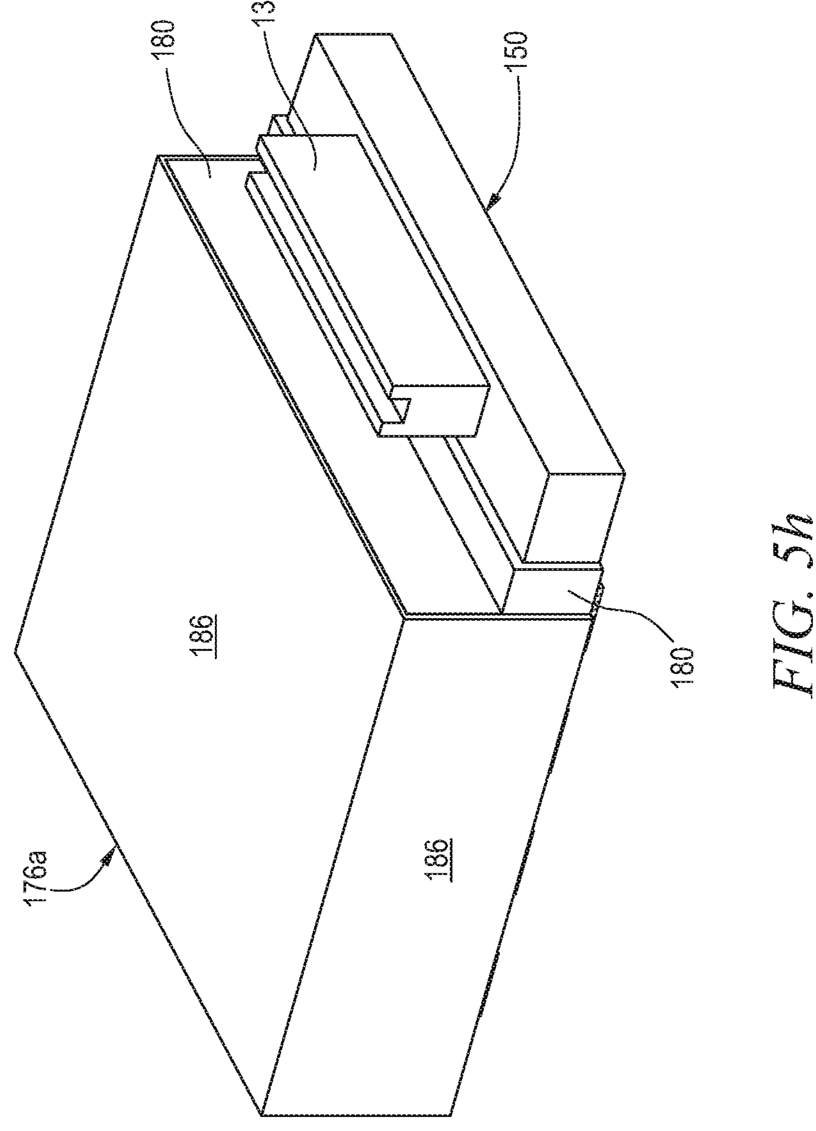

In FIG. 5*g*, cover mask 184 is removed leaving shielding material 180 and 186 covering the RF sensitive portions of RF AoP module 176*a*. Electrical connector 134 remains free of shielding material 180 and 186. FIG. 5*h* shows RF AoP module 176*a* with shielding material 180 and 186 covering the RF sensitive portions of the RF AoP module and no shielding material on electrical connector 134. The above-described two-step shielding process is suitable for the devices with the tight design rule or the devices incompatible with EMI shielding using cover masking method.

In another embodiment, continuing from FIG. 5*b*, cover mask 184 is disposed over electrical connector 134, as shown in FIG. 6*a*. Cover mask 184 covers or encloses electrical connector 134 with vertical portion 184*a* contacting upper surface 180*b* of shielding material 180. Cover mask 184 covers or encloses electrical connector 134 on all sides in a manner to prevent subsequently-applied shielding material from reaching the connector, similar to FIG. 5*e*.

In an alternate second step, electromagnetic shielding layer 190 is formed or disposed over surface 193 of encapsulant 170 by conformal application of the shielding material, as shown in FIG. 6*b*. Electromagnetic shielding material 190 can be one or more layers of Al, Cu, Sn, Ni, Au, Ag, or other suitable conductive material. Alternatively, electromagnetic shielding material 190 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 190 overlaps a first portion of electromagnetic shielding material 180, while a second portion of shielding material 180 remains under cover 184. In addition, electromagnetic shielding material 190 covers side surfaces 194 of encapsulant 170, as well as side surface 196 of substrate 150. At least to some extent, electromagnetic shielding material 190 covers cover mask 184, which is protecting electrical connector 134. Electrical connector 134 remains free of shielding material during this alternate second step.

In FIG. 6*c*, cover mask 184 is removed leaving shielding material 180 and 190 covering the RF sensitive portions of RF AoP module 176*a*. Electrical connector 134 remains free of shielding material 180 and 190. RF AoP module 176*a* with shielding material 180 and 190 covering the RF sensitive portions of the RF AoP module has no shielding material on electrical connector 134, similar to FIG. 5*h*. The above-described two-step shielding process is suitable for the devices with the tight design rule or the devices incompatible with EMI shielding using cover masking method.

In another embodiment, continuing from FIG. 5*a*, cover mask 184 is disposed over electrical connector 134, as shown in FIG. 7*a*. Cover mask 184 covers or encloses electrical connector 134 with vertical portion 184*a* contacting surface 156 of substrate 150. Cover mask 184 covers or encloses electrical connector 134 on all sides in a manner to prevent subsequently-applied shielding material from reaching the connector, similar to FIG. 5*e*.

In a first step, electromagnetic shielding layer 200 is formed or disposed over surface 202 of encapsulant 170 by conformal application of the shielding material, as shown in FIG. 7*b*. Electromagnetic shielding material 200 can be one or more layers of Al, Cu, Sn, Ni, Au, Ag, or other suitable conductive material. Alternatively, electromagnetic shielding material 200 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 200 covers side surfaces 204 of encapsulant 170, as well as side surface 206 of substrate 150. At least to some extent, electromagnetic shielding material 200 covers cover mask 184, which is protecting electrical connector 134. Electrical connector 134 remains free of shielding material during this first step.

In FIG. 7*c*, cover mask 184 is removed leaving shielding material 200 covering the RF sensitive portions of RF AoP module 176*a*.

Figure 7D:
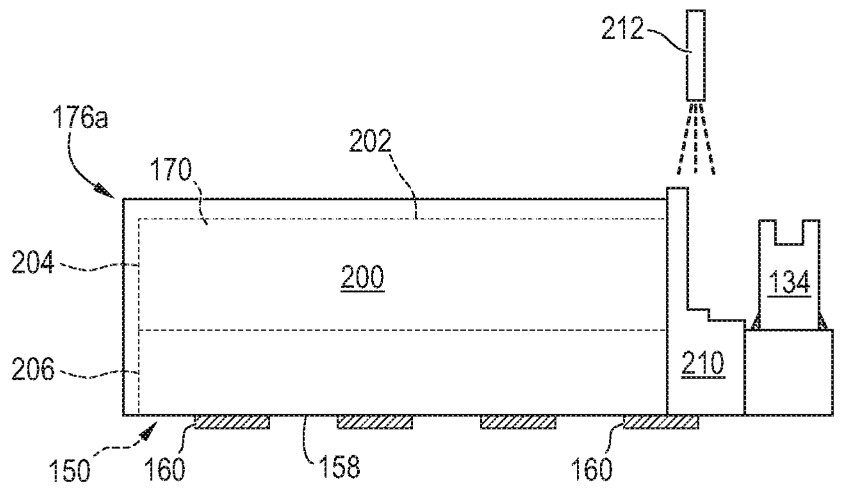

In a second step, electromagnetic shielding material 210 is applied over a portion of electromagnetic shielding material 200 and a portion of surface 156 of substrate 150, as shown in FIG. 7*d*. Electromagnetic shielding material 210 can be one or more layers of Al, Cu, Sn, Ni, Au, Ag, or other suitable conductive material. Alternatively, electromagnetic shielding material 210 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 210 is applied in a maskless manner, e.g., by direct jet printing using direct jet printer 212, with sufficient control to avoid getting shielding material on electrical connector 134. Shielding material 210 provides partial coverage of RF AoP module 176*a*, without encroaching on the area occupied by electrical connector 134. Electrical connector 134 remains free of shielding material 200 and 210. RF AoP module 176*a* with shielding material 200 and 210 covering the RF sensitive portions of the RF AoP module has no shielding material on electrical connector 134. The above-described two-step shielding process is suitable for the devices with the tight design rule or the devices incompatible with EMI shielding using cover masking method.

In another embodiment, continuing from FIG. 5*a*, cover mask 184 is disposed over electrical connector 134, as shown in FIG. 8*a*. Cover mask 184 covers or encloses electrical connector 134 with vertical portion 184*a* contacting surface 214 of encapsulant 170. Cover mask 184 covers or encloses electrical connector 134 on all sides in a manner to prevent subsequently-applied shielding material from reaching the connector.

In a first step, electromagnetic shielding layer 220 is formed or disposed over surface 214 of encapsulant 170 by conformal application of the shielding material, as shown in FIG. 8*b*. Electromagnetic shielding material 220 can be one or more layers of Al, Cu, Sn, Ni, Au, Ag, or other suitable conductive material. Alternatively, electromagnetic shielding material 220 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 220 covers side surfaces 224 of encapsulant 170, as well as side surface 226 of substrate 150. At least to some extent, electromagnetic shielding material 220 covers cover mask 184, which is protecting electrical connector 134. Electrical connector 134 remains free of shielding material during this first step.

In FIG. 8*c*, cover mask 184 is removed leaving shielding material 220 covering the RF sensitive portions of RF AoP module 176*a*.

Figure 8D:
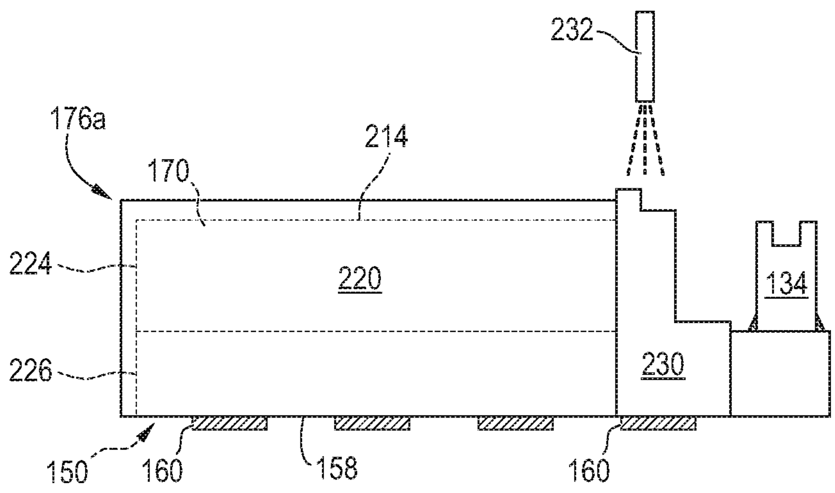

In a second step, electromagnetic shielding material 230 is applied over a portion of electromagnetic shielding material 220 and a portion of surface 156 of substrate 150, as shown in FIG. 8*d*. Electromagnetic shielding material 230 can be one or more layers of Al, Cu, Sn, Ni, Au, Ag, or other suitable conductive material. Alternatively, electromagnetic shielding material 230 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 230 is applied in a maskless manner, e.g., by direct jet printing using direct jet printer 232, with sufficient control to avoid getting shielding material on electrical connector 134. Shielding material 230 provides partial coverage of RF AoP module 176*a*, without encroaching on the area occupied by electrical connector 134. Electrical connector 134 remains free of shielding material 220 and 230. RF AoP module 176*a* with shielding material 220 and 230 covering the RF sensitive portions of the RF AoP module has no shielding material on electrical connector 134. The above-described two-step shielding process is suitable for the devices with the tight design rule or the devices incompatible with EMI shielding using cover masking method.

Figure 9:
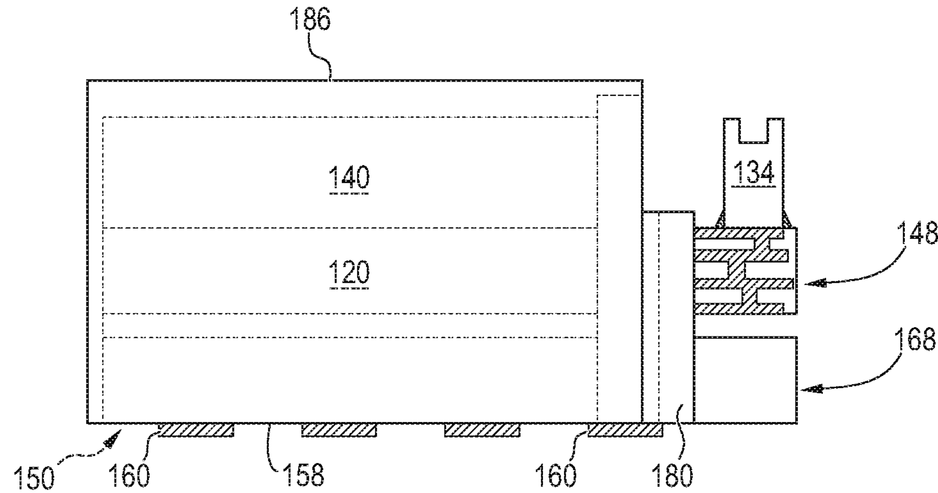
FIG. 9 illustrates the two-step shielding material on the AoP module from FIG. 4.

The two-step shielding process is applicable to semiconductor packages from FIGS. 2*a*-2*d* and 4. For example, FIG. 9 shows the RF AoP module singulated from FIG. 4 with the first step of shielding material 180 and the second step of shielding material 186. Again, electrical connector 134 remains free of shielding material 180 and 186.

Figure 10A:
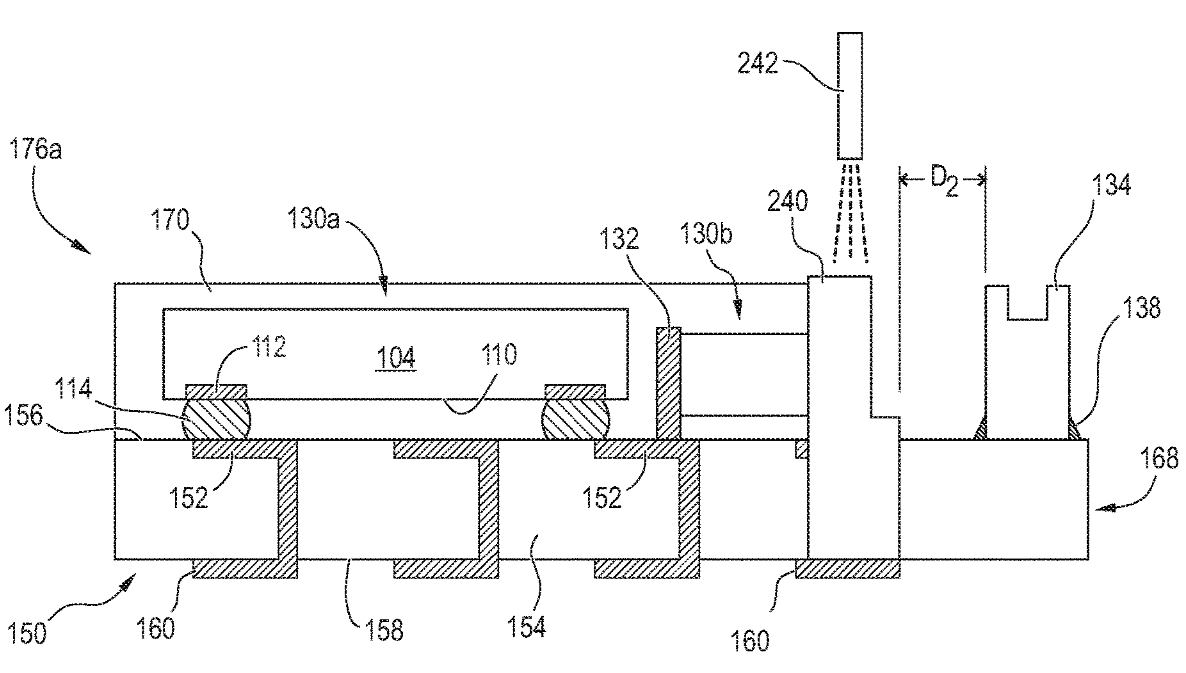
FIGS. 10*a*-10*k* illustrate application of shielding material to the AoP module using a two-step process with light sintering.

In another embodiment, a thin layer of powder material 240, in the form of nanoparticles, is directly applied as a paste or ink onto a portion of encapsulant 170 and a portion of surface 156 of substrate 150, as shown in FIG. 10*a*. Elements having a similar function are assigned the same reference number in the figures. Powder material 240 can be Ag, Cu, graphene coated Ag, graphene coated Cu, or combination thereof, with electromagnetic shielding properties. Powder material 240 is applied in a maskless manner, e.g., by direct jet printing using direct jet printer 242, with sufficient control to avoid getting the powder material on electrical connector 134.

Figure 10B:
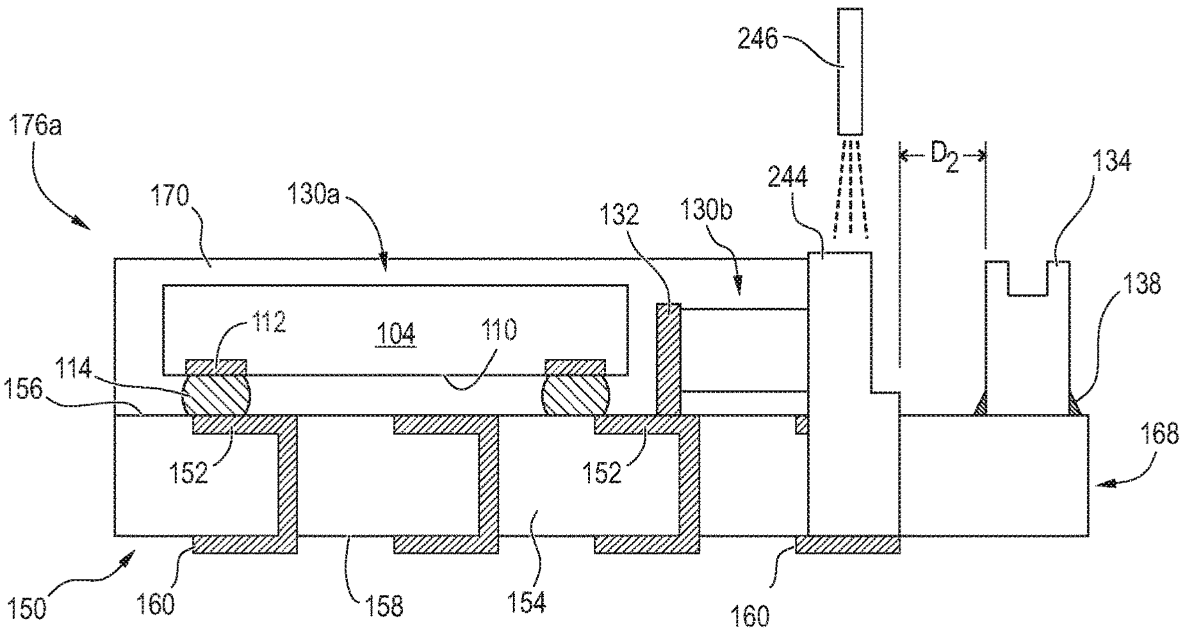

Alternatively, electromagnetic shielding material 244 is applied over a portion of encapsulant 170 and a portion of surface 156 of substrate 150, as shown in FIG. 10*b*. Electromagnetic shielding material 244 can be one or more layers of Al, Cu, Sn, Ni, Au, Ag, or other suitable conductive material. Electromagnetic shielding material 244 can also be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electrical connector 134 is mechanically and electrically connected to conductive layer 152 of substrate 150 with bumps or conductive paste 138. Electromagnetic shielding material 244 is applied in a maskless manner, e.g., by direct jet printing using direct jet printer 246, with sufficient control to avoid getting the shielding material on electrical connector 134. Shielding material 244 provides partial coverage of RF AoP module 176*a*, without encroaching on the area occupied by electrical connector 134. In one embodiment, the applied shielding material 244 remains separated from electrical connector 134 by distance D2 of at least 50.0 micrometers (μm).

Figure 10C:
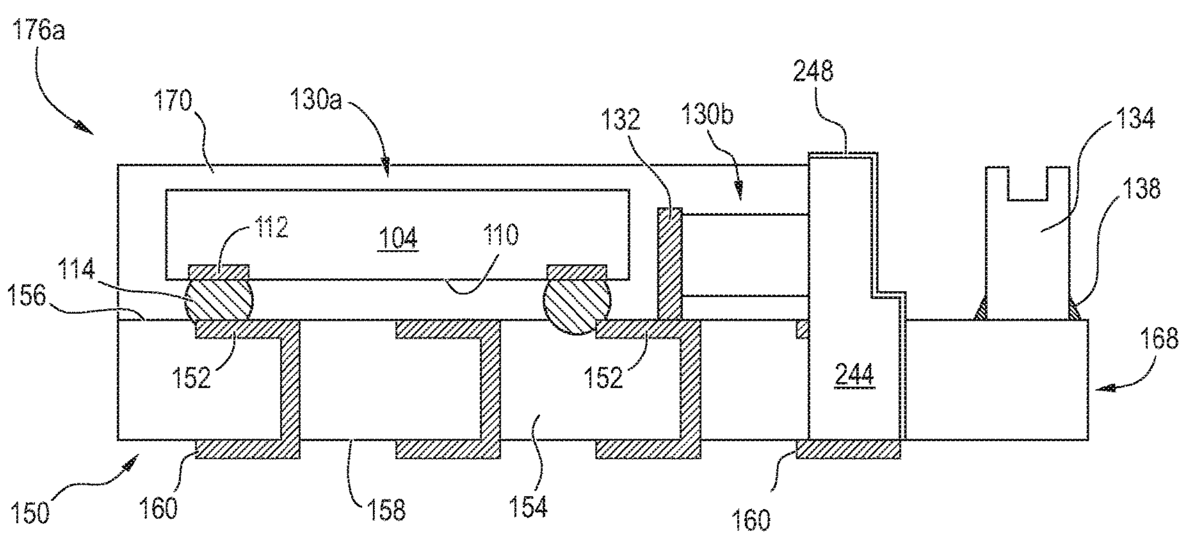

In FIG. 10*c*, a thin layer of powder material 248 is applied as a paste or ink onto electromagnetic shielding material 244. Powder material 248 is applied in a maskless manner, e.g., by direct jet printing using direct jet like printer 242, with sufficient control to avoid getting the powder material on electrical connector 134.

Figure 10D:
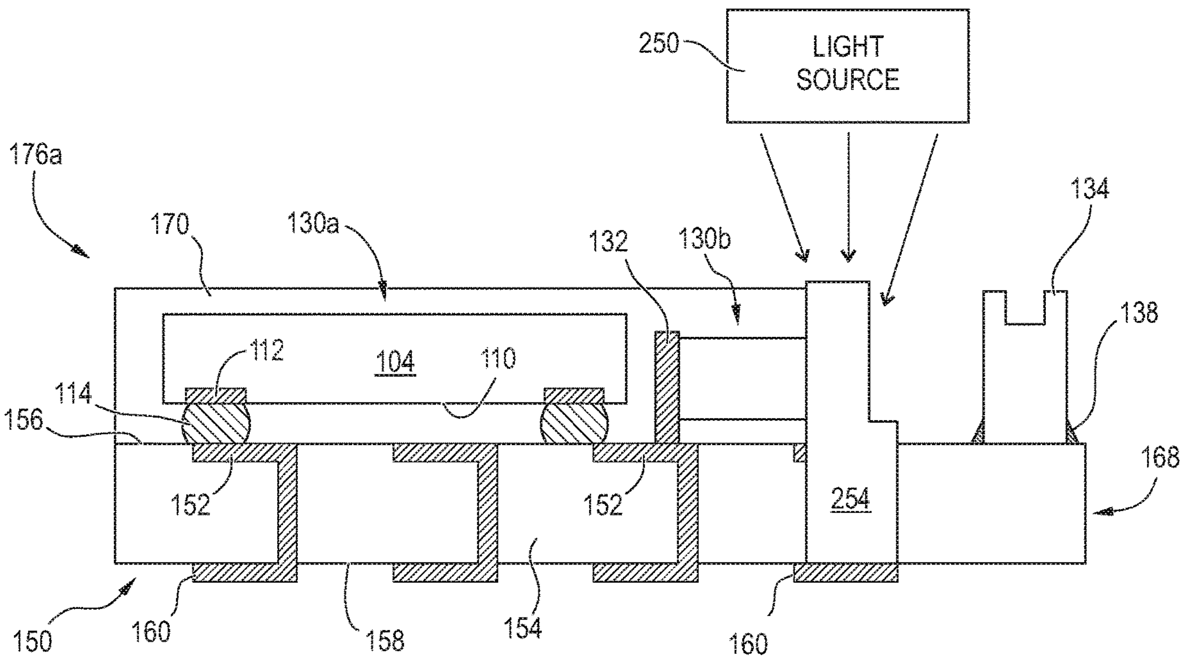

In FIG. 10*d*, light source 250 emits an ultraviolet light (UV) or intense pulsed light (IPL) onto powder material 240 from FIG. 10*a* or powder material 248 from FIG. 10*c* to effect a sintering process. The UV or IPL induces localized heating as powder material 240 or 248 is coalesced or absorbed into shielding material 254 by sintering. The distance D3 from light source 250 to or powder material 240 powder material 248 is about 14.0 mm. The duration of light source 250 is about 5.0 seconds, at a wavelength of 100-400 nanometers (nm) in the case of UV and 400-1200 nm in the case of IPL, to effect the sintering process. Sintering electromagnetic shielding material 254 provides greater strength, durability, conductivity, and adhesion.

Figure 10E:
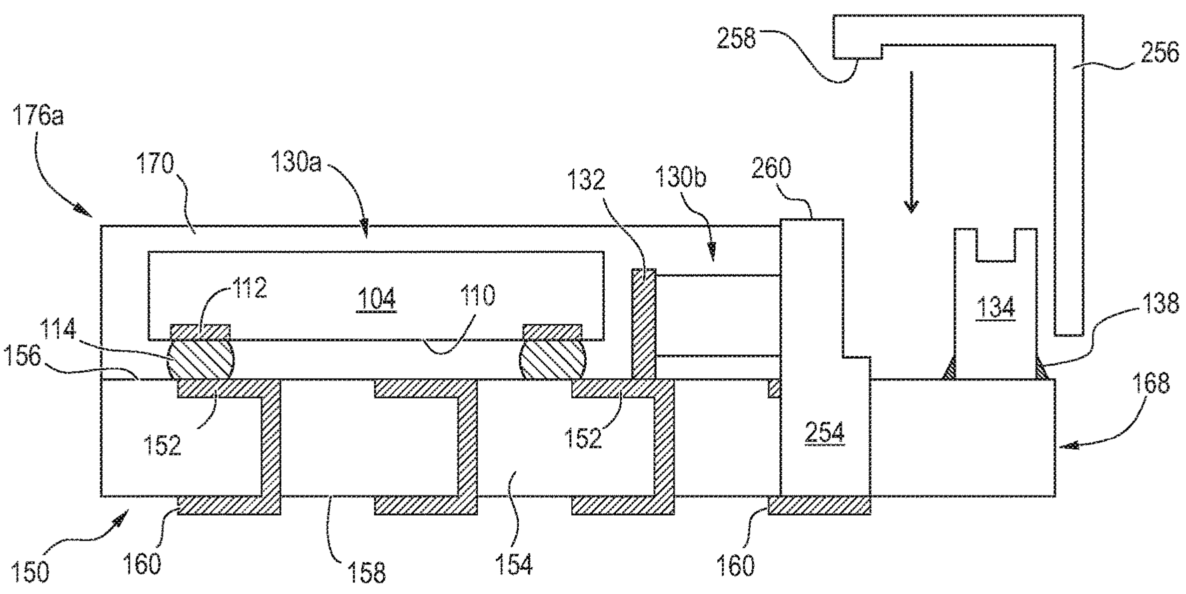
Figure 10F:
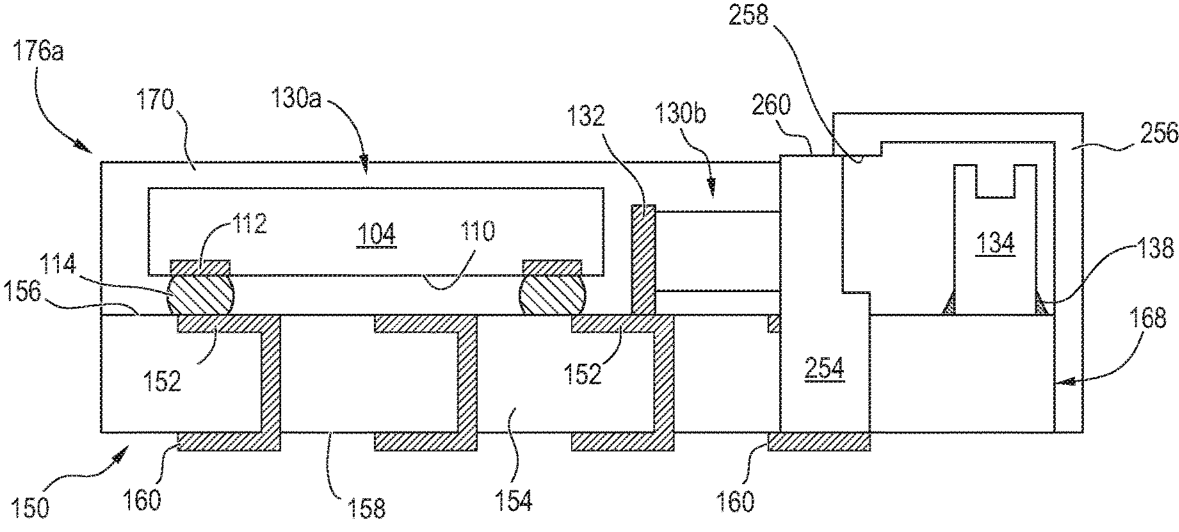
Figure 10G:
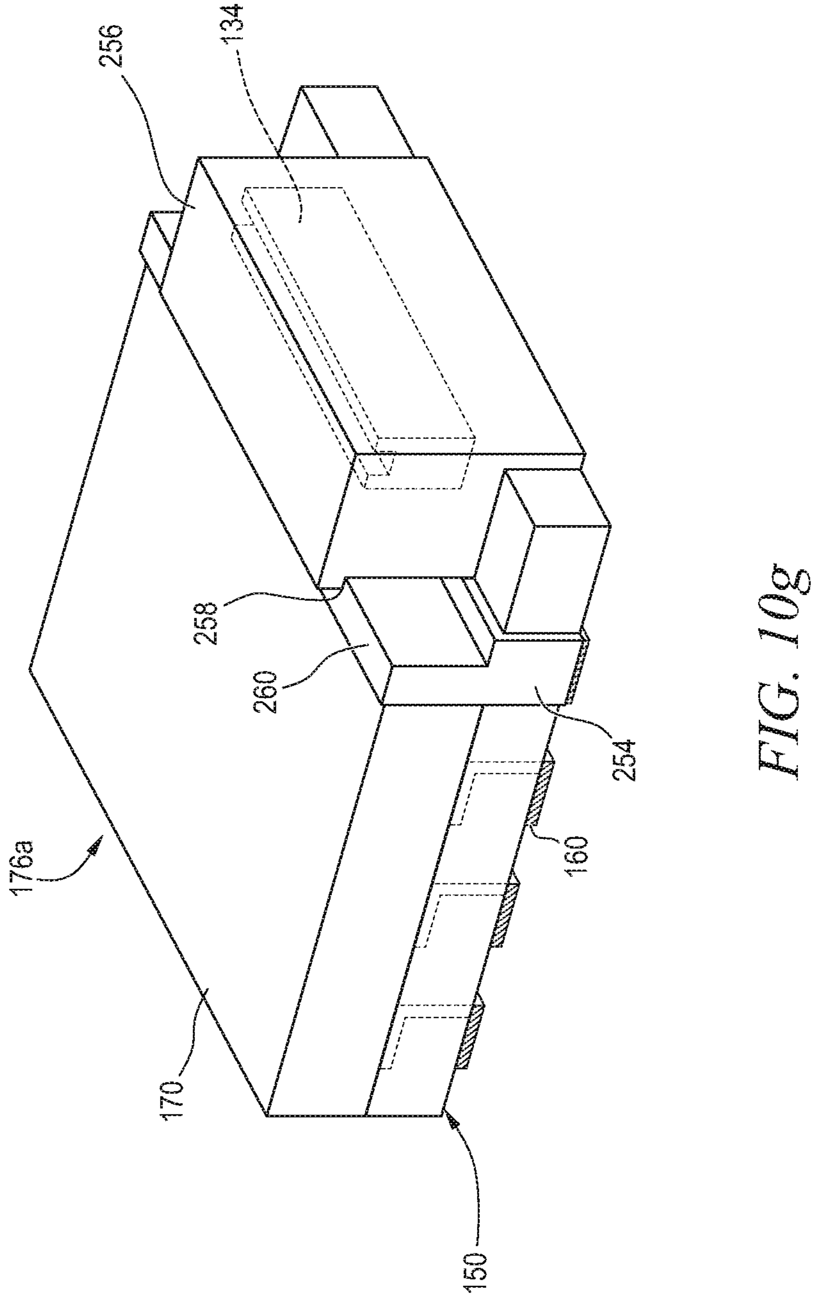

In FIG. 10*e*, cover mask 256 is positioned above electrical connector 134. Cover mask 256 is brought into contact with post-sintering shielding material 254. In particular, surface 258 of cover mask 256 is brought into contact with surface 260 of post-sintering shielding material 254. FIG. 10*f* shows cover mask 256 covering or enclosing electrical connector 134 with surface 258 contacting surface 260 of post-sintering shielding material 254. FIG. 10*g* is a perspective view of cover mask 256 enclosing electrical connector 134 on all sides in a manner to prevent subsequently-applied shielding material from reaching the connector.

Figure 10H:
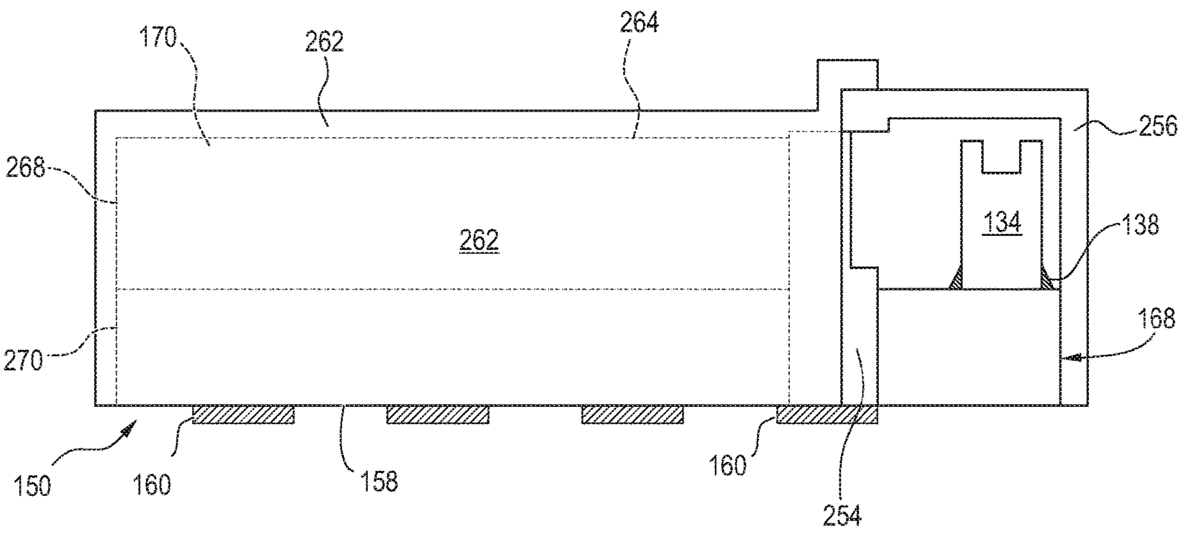
Figure 10I:
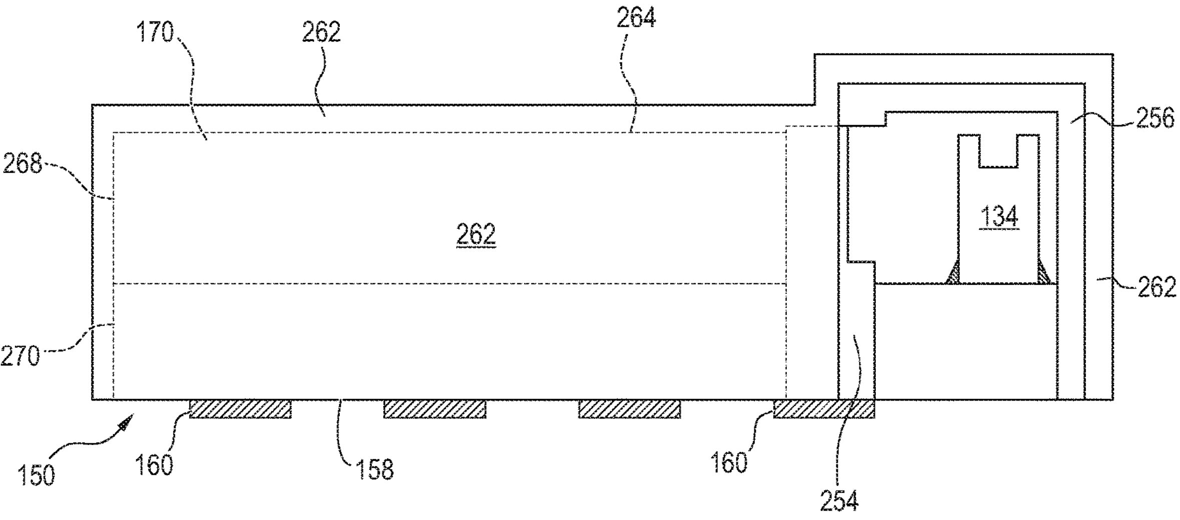

In a second step, electromagnetic shielding layer 262 is formed or disposed over surface 264 of encapsulant 170 by conformal application of the shielding material, as shown in FIG. 10*h*. Electromagnetic shielding material 262 can be one or more layers of Al, Cu, Sn, Ni, Au, Ag, or other suitable conductive material. Alternatively, electromagnetic shielding material 262 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 262 overlaps a first portion of post-sintering electromagnetic shielding material 254, while a second portion of post-sintering shielding material 254 remains under cover mask 256. In addition, electromagnetic shielding material 262 covers side surfaces 268 of encapsulant 170, as well as side surface 270 of substrate 150. At least to some extent, electromagnetic shielding material 262 covers cover mask 256, which is protecting electrical connector 134. FIG. 10*h* shows electromagnetic shielding material 262 partially covering cover mask 256. FIG. 10*i* shows electromagnetic shielding material 262 completely covering cover mask 256. Electrical connector 134 remains free of shielding material during this second step.

Figure 10J:
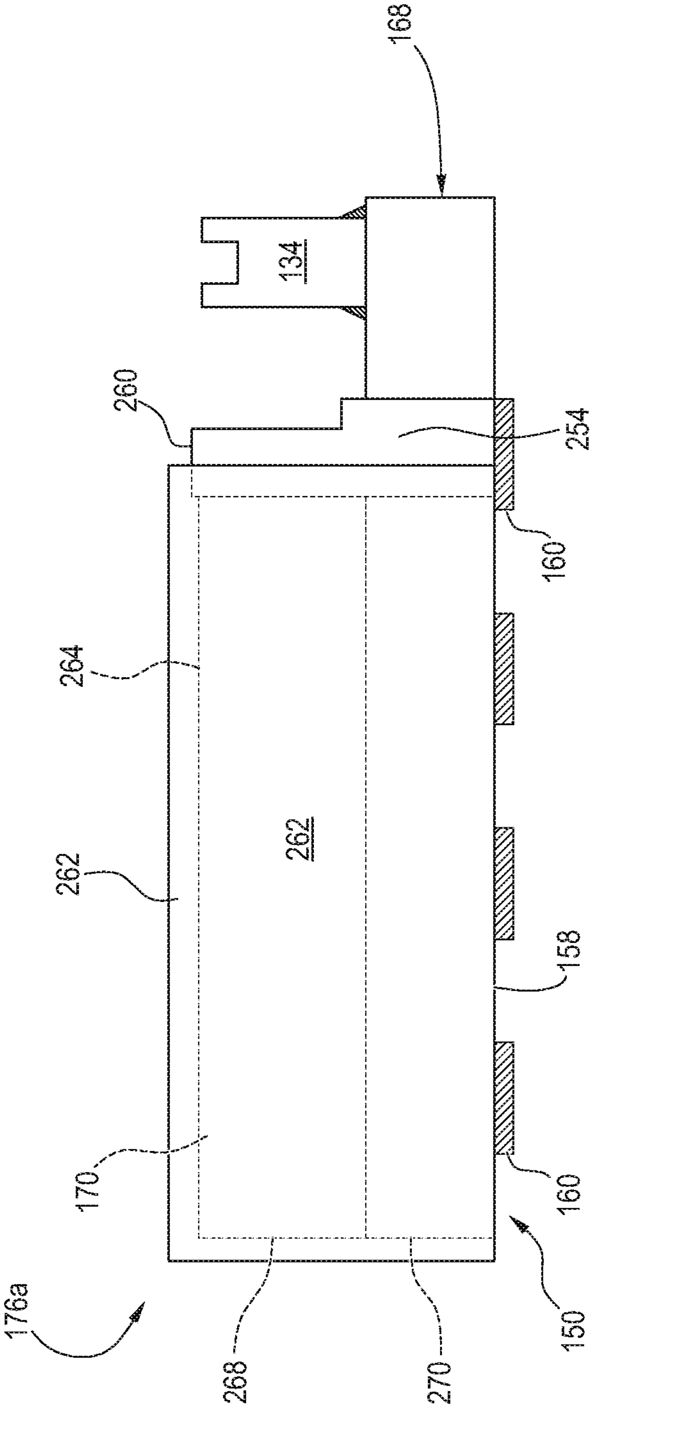
Figure 10K:
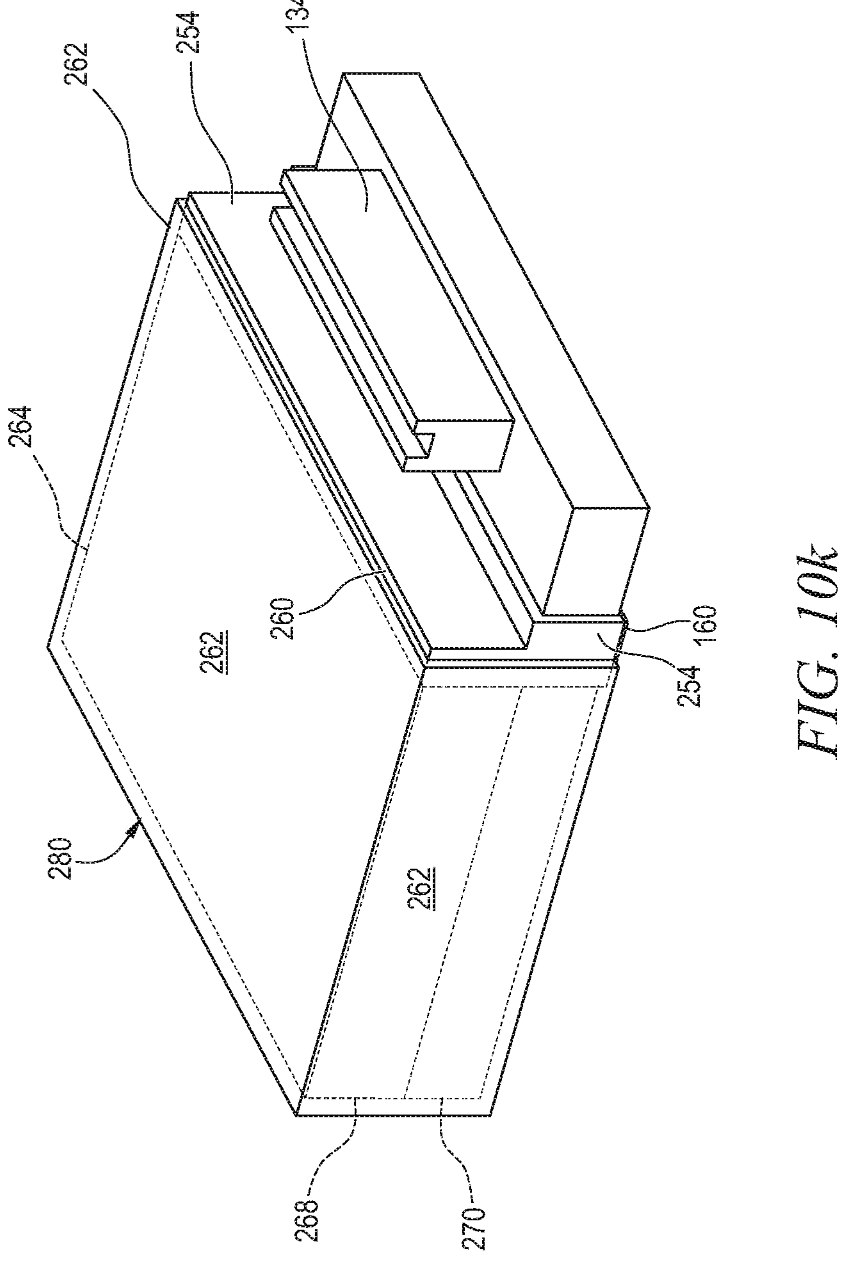

In FIG. 10*j*, cover mask 256 is removed leaving post-sintering shielding material 254 and 262 covering the RF sensitive portions of RF AoP module 176*a*. Electrical connector 134 remains free of shielding material 254 and 262. FIG. 10*k* shows RF AoP module 280 with post-sintering shielding material 254 and 262 covering the RF sensitive portions of the RF AoP module and no shielding material on electrical connector 134. The above-described two-step shielding process with light sintering is suitable for the devices with the tight design rule or the devices incompatible with EMI shielding using the cover masking method.

Figure 11:
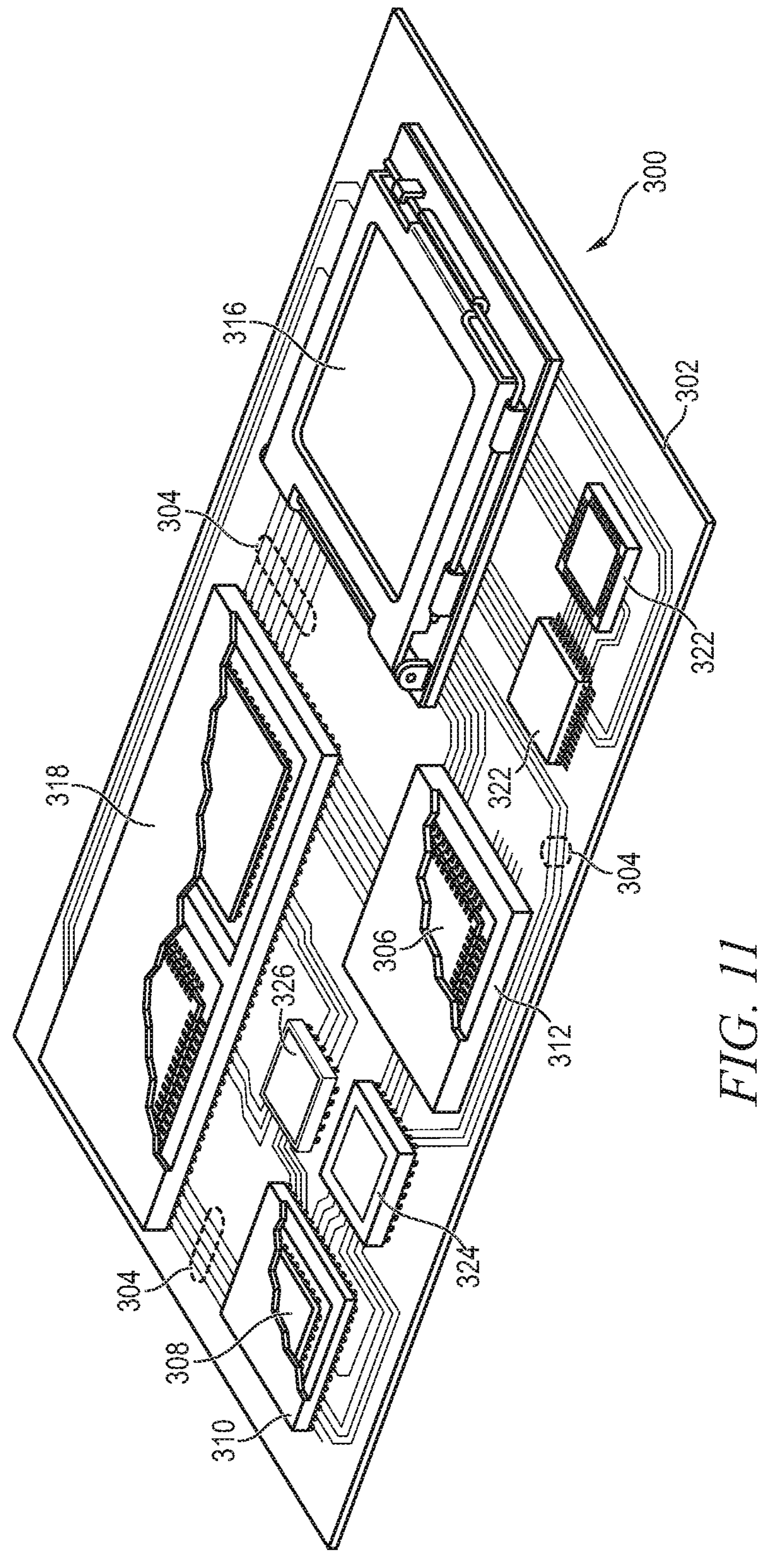
FIG. 11 illustrates a printed circuit board (PCB) with different types of packages disposed on a surface of the PCB.

FIG. 11 illustrates electronic device 300 having a chip carrier substrate or PCB 302 with a plurality of semiconductor packages disposed on a surface of PCB 302, including SiP module 148, RF AoP module 176*a*-176*b* and 280, and AoP modules from AoP wafer 172, all including shielding material 180, 186, 190, 200, 210, 220, 240, 244, 248, 254, 262, and 280 in the two-step process of the present invention. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 11, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown disposed on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate;

disposing an electrical connector over the first surface of the substrate;

depositing an encapsulant over a first surface of the substrate, wherein the electrical connector is disposed outside the encapsulant;

disposing a first shielding material over a portion of the encapsulant without covering the electrical connector with the first shielding material;

directing a light source at the first shielding material to induce sintering;

disposing a cover over the electrical connector; and disposing a second shielding material over the encapsulant, wherein the cover prevents the second shielding material from reaching the electrical connector.

2. The method of claim 1, further including disposing an electrical component over the substrate.

3. The method of claim 1, further including forming an antenna over a second surface of the substrate opposite the first surface of the substrate.

4. The method of claim 1, wherein the first shielding material covers the portion of the encapsulant and a portion of the substrate while maintaining separation from the electrical connector.

5. The method of claim 1, further including directing an ultraviolet light or intense pulsed light at the first shielding material to induce sintering.

6. The method of claim 1, further including disposing a material over the first shielding material prior to directing the light source at the first shielding material.

7. A method of making a semiconductor device, comprising:

providing a substrate;

disposing an electrical connector over a first surface of the substrate;

disposing a first shielding material over a portion of the substrate a distance from the electrical connector;

directing a light source at the first shielding material to induce sintering;

disposing a cover over the electrical connector; and disposing a second shielding material over the substrate, wherein the cover prevents the second shielding material from reaching the electrical connector.

8. The method of claim 7, further including:

disposing an electrical component over the substrate; and depositing an encapsulant over the electrical component and substrate.

9. The method of claim 7, further including forming an antenna over a second surface of the substrate opposite the first surface of the substrate.

10. The method of claim 7, wherein the second shielding material overlaps the first shielding material.

11. The method of claim 7, wherein the first shielding material covers the portion of the substrate without covering the electrical connector with the first shielding material.

12. The method of claim 11, further including directing an ultraviolet light or intense pulsed light at the first shielding material to induce sintering.

13. The method of claim 7, further including disposing a material over the first shielding material prior to directing the light source at the first shielding material.

14. A method of making a semiconductor device, comprising:

providing a substrate;

disposing an electrical connector over the first surface of the substrate;

depositing an encapsulant over a first surface of the substrate, wherein the electrical connector is disposed outside the encapsulant;

disposing a first shielding material over a portion of the encapsulant without covering the electrical connector with the first shielding material;

disposing a cover over the electrical connector; and disposing a second shielding material disposed over the encapsulant.

15. The method of claim 14, further including electrical component over the substrate.

16. The method of claim 14, further including disposing an antenna over a second surface of the substrate opposite the first surface of the substrate.

17. The method of claim 14, further including covering the portion of the encapsulant and a portion of the substrate with the first shielding material while maintaining separation from the electrical connector.

18. The method of claim 14, further including directing a light source at the first shielding material to induce sintering.

19. The method of claim 14, further including disposing a material over the first shielding material.

20. A method of making a semiconductor device, comprising:

providing a substrate;

electrical connector over the substrate;

disposing a first shielding material over a portion of the substrate a distance from the electrical connector;

directing a light source at the first shielding material to induce sintering;

disposing a cover over the electrical connector; and disposing a second shielding material disposed over the substrate.

21. The method of claim 20, further including:

disposing an electrical component over the substrate; and depositing an encapsulant over the electrical component and substrate.

22. The method of claim 20, further including disposing an antenna over the substrate.

23. The method of claim 20, further including overlapping the first shielding material with the second shielding material.

24. The method of claim 20, further including covering the portion of the substrate with the first shielding material without covering the electrical connector with the first shielding material.

* * * * *